United States Patent
Carman et al.

(10) Patent No.: US 9,166,147 B2
(45) Date of Patent: Oct. 20, 2015

(54) TUNABLE AND METASTABLE FERROELECTRIC MATERIALS AND MAGNETO-ELECTRIC DEVICES

(75) Inventors: Gregory P. Carman, Los Angeles, CA (US); Kang-Lung Wang, Santa Monica, CA (US); Tao Wu, Hillsboro, OR (US); Alexandre Bur, Lausanne (CH); Pedram Khalili Amiri, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/113,562

(22) PCT Filed: Apr. 27, 2012

(86) PCT No.: PCT/US2012/035584
§ 371 (c)(1),
(2), (4) Date: Oct. 23, 2013

(87) PCT Pub. No.: WO2012/149414
PCT Pub. Date: Nov. 1, 2012

(65) Prior Publication Data
US 2014/0042574 A1 Feb. 13, 2014

Related U.S. Application Data

(60) Provisional application No. 61/479,739, filed on Apr. 27, 2011.

(51) Int. Cl.
*H01L 29/82* (2006.01)
*H01L 43/10* (2006.01)
*H01L 41/187* (2006.01)
*H01L 43/02* (2006.01)

(52) U.S. Cl.
CPC ............ *H01L 43/10* (2013.01); *H01L 41/1875* (2013.01); *H01L 43/02* (2013.01)

(58) Field of Classification Search
CPC ...... H01L 43/10; H01L 43/02; H01L 41/1875
USPC ........................................................ 257/421
See application file for complete search history.

(56) References Cited

U.S. PATENT DOCUMENTS

| 5,790,156 A * | 8/1998 | Mutton et al. ................... 347/71 |
| 5,804,907 A | 9/1998 | Park et al. |
| 2003/0154911 A1 | 8/2003 | Eissler |
| 2004/0178841 A1* | 9/2004 | Mantese et al. ............... 327/509 |

(Continued)

OTHER PUBLICATIONS

Arimoto and H. Ishiwara, MRS bulletin 29, 823-828 (2004).

(Continued)

*Primary Examiner* — Matthew Landau
*Assistant Examiner* — Igwe U Anya
(74) *Attorney, Agent, or Firm* — Venable LLP; Henry J. Daley; Laura G. Remus

(57) ABSTRACT

A ferroelectric device includes a first electrode, a second electrode spaced apart from the first electrode, and a ferroelectric element arranged between the first and second electrodes. The ferroelectric element has a plurality of quasistatic strain configurations that are selectable by the application of an electric field and the device has selectable electromechanical displacement by the application of the electric field.

6 Claims, 36 Drawing Sheets

(56) References Cited

U.S. PATENT DOCUMENTS

| | | | |
|---|---|---|---|
| 2005/0195631 A1* | 9/2005 | Schindler et al. | 365/145 |
| 2007/0152182 A1* | 7/2007 | Yasuda et al. | 252/62.9 PZ |
| 2008/0211881 A1* | 9/2008 | Ifuku et al. | 347/70 |
| 2009/0289526 A1* | 11/2009 | Sinha et al. | 310/325 |
| 2010/0299115 A1* | 11/2010 | Obradovic et al. | 703/2 |
| 2010/0320868 A1* | 12/2010 | Kushnir et al. | 310/317 |
| 2011/0017937 A1 | 1/2011 | Luo et al. | |

OTHER PUBLICATIONS

Bibes and A. Barthelemy, Nat Mater 7, 425 (2008).
Bur, T. Wu, J. Hockcl, C.-J. Hsu, H. K. D. Kim, T.-K. Chung, K. Wong, K. L. Wang, and G. P. Carman, J. Appl. Phys. 109, 123903 (2011).
Cheong and M. Mostovoy, Nat. Mater. 6 (1), 13 (2007).
Chu et al., Nat Mater 7, 478 (2008).
Chung et al., J. Appl. Phys. 106 (10), 103914 (2009).
Chung et al., Appl. Phys. Lett. 94 (13),; 132501 (2009).
Colla, et al., "Dielectric properties of PMN(1-x)-PT(x) single crystals for various electrical and thermal histories," J. Appl. Phys., vol. 83, pp. 3298-3304, 1998.
Eerenstein, N. D. Mathur, and J. F. Scott, Nature 442 (7104), 759; (2006).
Fiebig, J. Phys. D, Appl. Phys. 38 (8), R123 (2005).
Fu and R. Cohen, Nature 403 (6767), 281 (2000).
Han et al., "Electric field effects on the phase transitions in [001]-oriented (1-x) Pb (Mgl/3Nb2/3) 03-xPbTiO3 single crystals with compositions near the morphotropic phase boundary," Physical Review B, vol. 68, p. 134102, 2003.
Heywang, K. Lubitz, W. Wersing, and L. E. Cross, in Piezoelectricity; (Springer Berlin Heidelberg, 2008), vol. 114, pp. 131.
Hilton et al., Fen-oelectrics 93, 379-386 (1989).
Hu and C. W. Nan, Phys. Rev. B 80 (22), 224416 (2009).
Hu et al., J. Appl. Phys. 107 (9), 093912 (2010).
Hu et al., J. Appl. Phys. 108 (4), 043909 (2010).
Kiat, et al., "Monoclinic structure of unpoled morphotropic high piezoelectric PMN-PT and PZN-PT compounds," Physical Review B, vol. 65, p. 064106, 2002.
Klaui et al., Appl. Phys, Lett. 78, 3268 (2001).
Klaui et al., Phys. Rev. Lett. 94, 106601 (2005).
Kub et al., Electronics Letters 35, 477-478-1999.
Kutnjak, et al., "The giant electromechanical response in ferroelectric relaxors as a critical phenomenon," Nature, vol. 441, pp. 956-959, 2006.
Lai et al., IEEE Trans. Mag. 38, 2550 (2002).
Lancaster, J. Powell and A. Porch, Superconductor Science and Technology 11, 1323 (1998).
Li et al., Appl. Phys. Lett. 96, 162505 (2010).
Li, et al., "Dielectric/ferroelectric response and phase transition of PMNO. 32PT single crystal," Journal of Materials Science Letters, vol. 21, pp. 1325-1327, 2002.
Lin et al., Phys. Status Solidi 4, 4360 (2007).
Lin, et al., "Electric-field and temperature induced phase transitions in Pb(Mgl/3Nb2/3)03-0.3PbTiO3 single crystals," J. Appl. Phys., vol. 108, pp. 034112-034114, 2010.
Liu et al., "Orientation Dependence of Nonlinearity and Hysteresis in PZN-4.5%PT Single Crystals II: Bipolar Electromechanical Response," J. Intell. Mater. Syst. Struct, vol. 17, pp. 931-937, Oct. 1, 2006.
Liu et al., Acta Materialia 51 (2), 407 (2003).
Liu et al., Integrated Ferroelectrics 71 (1), 173 (2005).
Liu et al., Adv. Funct. Mater. 19, 1826 (2009).
Liu et al., J. Appl. Phys. 107, 073916 (2010).
Liu, et al., "Electric field dependence of piezoelectric properties for rhombohedral 0.955Pb(Zn[sub 1/3]Nb[sub 2/3])O[sub 3]—0.045PbTiO[sub 3] single crystals," J. Appl. Phys., vol. 85, pp. 2810-2814, 1999.
Lu, et al., "Phase transitional behavior and piezoelectric properties of the orthorhombic phase of Pb(Mg1/3Nb2/3)03-PbTiO3 single crystals," Appl. Phys. Lett., vol. 78, pp. 3109-3111, 2001.
McLaughlin, et al., "Relaxor ferroelectric PMN-32%PT crystals under stress, electric field and temperature loading: 11-33-mode measurements," Acta Materialia, vol. 53, pp. 4001-4008, 2005.
Meier et al., Phys. Rev. Lett. 98, 187202 (2007).
Nam et al., Appl. Phys. Lett. 94, 082501 (2009).
Nan et al., Phys. 103 (3), 031101 (2008).
Noheda et al., Physical Review B 66 (5), 054104 (2002).
Park et al., "Ultrahigh strain and piezoelectric behavior in relaxor based ferroelectric single crystals," J. Appl. Phys., vol. 82, pp. 1804-1811, 1997.
Park et al., Phys. Rev. B 73, 094424 (2006).
Pavan et al., Proceedings of the IEEE 85, 1248-1271 (1997).
Pertsev et al., Appl. Phys. Lett. 95 (16), 163503 (2009).
Rajan et al., Dielectric and piezoelectric properties of [001] and [011];-poled relaxor ferroelectric PZN-PT and PMN-PT single crystals, Sensors and Actuators A, Jan. 2007, vol. 133, Issue 1, pp. 110-116.
Ren, et al., "Piezoelectric properties and phase transitions of <001>-oriented Pb(Znl/3Nb2/3)03-PbTiO3 single crystals," Appl. Phys. Lett., vol. 80, pp. 3174-3176, 2002.
Rothman, et al., Phys. Rev. Lett. 86, 1098 (2001).
Ryu et al., Electroceram. 7, 24 (2001).
Scheinfein and E. Price, in http://11gmicro.home.mindspring.com/.
Scott, Nat. Mater. 6, 256 (2007).
Singh et al., Physical Review B 67 (6), 064102 (2003).
Stoner et al., Philos. Trans. R. Soc. London, Ser. A 240, 599 (1948).
Tagantsev et al., Journal of Electroceramics 11, 5-66 (2003).
Tokura, Science 312 (5779), 1481 (2006).
Uchino, Ferroelectrics 151 (1), 321 (1994).
Viehland et al., "Anhysteretic field-induced rhombhohedral to orthorhombic transformation in <110>-oriented 0.7Pb(Mg1/3Nb2/3)03-0.3PbTiO3 crystals," J. Appl. Phys., vol. 92, pp. 7690-7692, 2002.
Wan, et al., "Abnormal phase transitions for tetragonal (1-x)Pb(Mg1/3Nb2/303-xPbTiO3 single crystals at low temperature," J. Appl. Phys., vol. 96, pp. 6574-6577, 2004.
Wang, Appl. Phys. Lett. 90, 212903 (2007).
Weisheit et al., Science 315, 349 (2007).
Wu et al., Appl. Phys. Lett. 98, 262504 (2011).
Wu et al., IEEE Magn. Lett. 2, 6000104 (2011).
Wu et al., IEEE Trans. Magn. 45 (10), 4333 (2009).
Wu et al., J. Appl. Phys. 106 (5), 054114 (2009).
Wu et al., J. Appl. Phys. 107 (9), 09D912 (2010).
Wu et al., J. Appl. Phys. 109 (2011).
Wu, et al., "Giant electric-field-induced reversible and permanent magnetization reorientation on magnetoelectric Ni/(011) [Pb(Mg1/3Nb2/3)03](1-x)-[PbTiO3]x heterostructure," Appl. Phys. Lett, vol. 98, p. 012504, 2011.
Ye et al., "Morphotropic domain structures and phase transitions in relaxor-based piezo-/ferroelectric (1-x)Pb(Mg1/3Nb2/3)03-xPbTiO3 single crystals," J. Appl. Phys., vol. 87, pp. 2312-2319, 2000.
Ye, Current Opinion in Solid State and Materials Science 6 (1), 35; (2002).
Yiping, et al., "Domain Configuration and Ferroelectric Related Properties of the (110) cub Cuts of Relaxor-Based Pb (Mgl= 3Nb2= 3) 03-PbTiO3 Single Crystals," Jpn. J. Appl. Phys, vol. 41, pp. 1451-1454, 2002.
Yoo et al., Appl. Phys. Lett. 82, 2470 (2003).
Zavaliche et al., Nano. Lett. 7(6), 1586 (2007).
Zhai et al., Appl. Phys. Lett. 88 (6), 062510 (2006).
Zhang, Appl. Phys. Lett. 82, 787 (2003).
Zhao et al., Appl. Phys. Lett. 94 (24), 243507 (2009).
Zhao, et al., "Dielectric and piezoelectric performance of PMN-PT single crystals with compositions around the MPB: influence of composition, poling field and crystal orientation," Materials Science and Engineering B, vol. 96, pp. 254-262, 2002.
Zhu, P. Ieee 96, 1786 (2008).
Zuyong and et al., "Electric field effects on the domain structures and the phase transitions of 0.62Pb(Mg1/3Nb2/3)03-0.38PbTiO3 single crystals with different orientations," Journal of Physics: Condensed Matter, vol. 16, p. 3769, 2004.

* cited by examiner (a) AFM (b) PFM (c) TEM SAD pattern (d) HRTEM

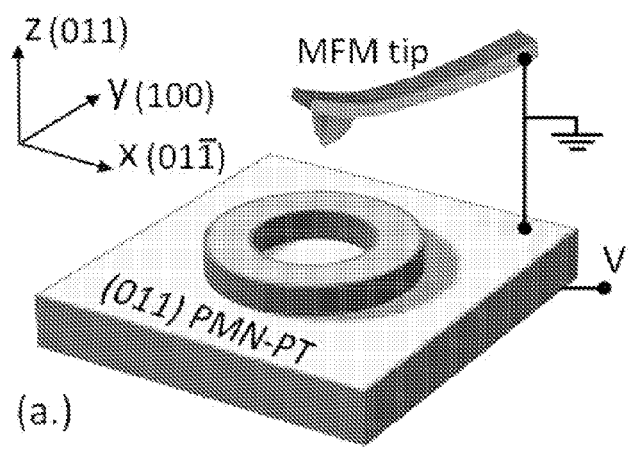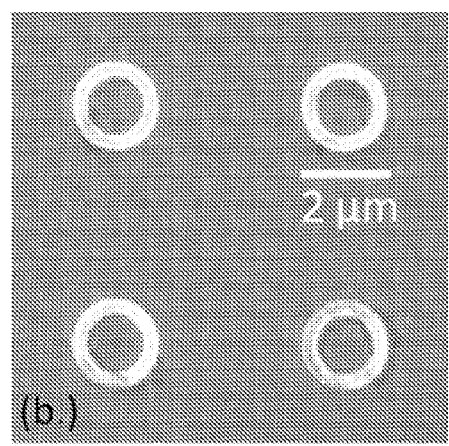
FIG. 26A                         FIG. 26B

TUNABLE AND METASTABLE FERROELECTRIC MATERIALS AND MAGNETO-ELECTRIC DEVICES

CROSS-REFERENCE OF RELATED APPLICATION

This is a national stage application under 35 U.S.C. §371 of PCT/US2012/035584 filed Apr. 27, 2012, the entire contents of which are incorporated herein by reference and this application claims priority to U.S. Provisional Application No. 61/479,739 filed Apr. 27, 2011, the entire contents of which are hereby incorporated by reference.

This invention was made with Government support under HR0011-10-C-0153, awarded by the United States Department of Defense, Defense Advanced Research Projects Agency and FA9550-09-1-0677, awarded by the United States Air Force, Air Force Office of Scientific Research. The Government has certain rights in the invention.

BACKGROUND

1. Field of Invention

The field of the currently claimed embodiments of this invention relates to devices that incorporate ferroelectric materials.

2. Discussion of Related Art

Single crystal relaxor ferroelectrics, such as [Pb(Zn1/3Nb2/3)O3](1−x)-[PbTiO3]x (PZN-xPT, 0<x<0.1) and [Pb(Mg1/3Nb2/3)O3](1−x)-[PbTiO3]x (PMN-xPT, 0<x<0.35), exhibit unique dielectric and electromechanical properties. Previous studies focused on mapping the phase-composition diagram,[1-3] temperature dependence,[4-10] and electric field or stress induced phase transitions[11-18].

Park and Shrout [2] performed some systematic measurements on the piezoelectric properties of compositions of single crystals in both the PMN:PT and the PZN:PT systems. For composition in the ferroelectric rhombohedra phase field close to the morphotropic phase boundary (MPB), the piezoelectric coefficient d33 is larger than 2500 pm/V and electromechanical coupling k33 is larger than 0.94. Vieland and Li [14] reported anhysteric quasi-linear strain response and electric field-induced rhombohedral to orthorhombic phase transformation in <110> oriented 0.7Pb(Mg1/3Nb2/3)O3]-0.3[PbTiO3] crystals. Kutnjak et al. [10] showed that the giant electromechanical response in PMN-PT (and potentially other ferroelectric relaxors) is the manifestation of critical points that define a line in the phase diagram. Specifically, the paraelectric-ferroelectric phase transition in PMN-PT terminates in a line of critical points where the piezoelectric coefficient is maximum. Yiping et al. [15] reported domain configuration and ferroelectric properties of (011) cut relaxor-based PMN-PT single crystals. Within the morphotropic phase boundaries (MPB) region, three phase and domain configurations are present, denoted by "R-O", "O" and "R". The PMN-PT single crystals in all three configurations exhibit a giant electric field poling induced remanent strain. Particularly in the "R" composition region, a monodomain orthorhombic ferroelectric state can be achieved by applying an electric field.

U.S. Patent Pub. No. 2011/0017937 A1 describes <110> domain engineered relaxor-PT single crystals having a dielectric loss of about 0.2%, a high electromechanical quality factor greater than about 85%, and high mechanical quality factor greater than about 500.

The relaxor-PT single crystals may be formed using the Vertical Bridgeman method. The <110> single crystal has a strong anisotropic behavior due to a macroscopic mm2 symmetry as compared isotropic behavior of a 4 mm symmetry <001> poled crystal. The figure of merit (FOM) or d33Q33 for the <110> oriented crystals was much higher than the value obtained from <001> oriented crystals.

U.S. Patent Pub. No. 2003/0154911 A1 describes a method of growing single crystals of lead magnesium niobate-lead titanate (PMN-PT) near the MBP. The method includes providing a flat-bottomed iridium crucible containing PMN-PT starting material, and placing the crucible into a vertical Bridgeman furnace having at least two temperature zones. The starting materials include high purity (>99%) powders of $Pb_3O_4$, $MgCO_3$, $Nb_2O_5$ and $TiO_2$. Raw powders of the starting materials are weighed in desired molar ratios with excess $Pb_3O_4$ as a flux. The first temperature zone has a temperature higher than a melting temperature of the PMN-PT material, and the second temperature zone has a temperature less than the melting temperature of the PMN-PT material. The single crystals of PMN-PT prepared using this method exhibits a [110] crystal orientation. However, conventional devices that use ferroelectric materials require constant power to maintain the ferroelectric in a strained state. Therefore, there remains a need for improved devices that incorporate ferroelectric materials.

Background References

[1] Z.-G. Ye and M. Dong, "Morphotropic domain structures and phase transitions in relaxor-based piezo-/ferroelectric (1−x)Pb(Mg1/3Nb2/3)O3-xPbTiO3 single crystals," J. Appl. Phys., vol. 87, pp. 2312-2319, 2000.

[2] S.-E. Park and T. R. Shrout, "Ultrahigh strain and piezoelectric behavior in relaxor based ferroelectric single crystals," J. Appl. Phys., vol. 82, pp. 1804-1811, 1997.

[3] J.-M. Kiat, et al., "Monoclinic structure of unpoled morphotropic high piezoelectric PMN-PT and PZN-PT compounds," Physical Review B, vol. 65, p. 064106, 2002.

[4] E. V. Colla, et al., "Dielectric properties of PMN(1−x)-PT (x) single crystals for various electrical and thermal histories," J. Appl. Phys., vol. 83, pp. 3298-3304, 1998.

[5] Z. Li, et al., "Dielectric/ferroelectric response and phase transition of PMN0.32PT single crystal," Journal of Materials Science Letters, vol. 21, pp. 1325-1327, 2002.

[6] X. Zhao, et al., "Dielectric and piezoelectric performance of PMN-PT single crystals with compositions around the MPB: influence of composition, poling field and crystal orientation," Materials Science and Engineering B, vol. 96, pp. 254-262, 2002.

[7] X. Wan, et al., "Abnormal phase transitions for tetragonal (1−x)Pb(Mg1/3Nb2/3O3-xPbTiO3 single crystals at low temperature," J. Appl. Phys., vol. 96, pp. 6574-6577, 2004.

[8] F. Zuyong and et al., "Electric field effects on the domain structures and the phase transitions of 0.62Pb(Mg1/3Nb2/3)O3-0.38PbTiO3 single crystals with different orientations," Journal of Physics: Condensed Matter, vol. 16, p. 3769, 2004.

[9] E. A. McLaughlin, et al., "Relaxor ferroelectric PMN-32%PT crystals under stress, electric field and temperature loading: II-33-mode measurements," Acta Materialia, vol. 53, pp. 4001-4008, 2005.

[10] Z. Kutnjak, et al., "The giant electromechanical response in ferroelectric relaxors as a critical phenomenon," Nature, vol. 441, pp. 956-959, 2006.

[11] J. Han and W. Cao, "Electric field effects on the phase transitions in [001]-oriented (1−x) Pb (Mg1/3Nb2/3)O3-xPbTiO3 single crystals with compositions near the morphotropic phase boundary," Physical Review B, vol. 68, p. 134102, 2003.

[12] W. Ren, et al., "Piezoelectric properties and phase transitions of <001>-oriented Pb(Zn1/3Nb2/3)O3-PbTiO3 single crystals," Appl. Phys. Lett., vol. 80, pp. 3174-3176, 2002.
[13] S.-F. Liu, et al., "Electric field dependence of piezoelectric properties for rhombohedral 0.955Pb(Zn[sub 1/3]Nb[sub 2/3])O[sub 3]—0.045PbTiO[sub 3] single crystals," J. Appl. Phys., vol. 85, pp. 2810-2814, 1999.
[14] D. Viehland and J. F. Li, "Anhysteretic field-induced rhombhohedral to orthorhombic transformation in <110>-oriented 0. 7Pb(Mg1/3Nb2/3)O3-0.3PbTiO3 crystals," J. Appl. Phys., vol. 92, pp. 7690-7692, 2002.
[15] G. Yiping, et al., "Domain Configuration and Ferroelectric Related Properties of the (110) cub Cuts of Relaxor-Based Pb (Mg=3Nb2=3) O3-PbTiO3 Single Crystals," Jpn. J. Appl. Phys, vol. 41, pp. 1451-1454, 2002.
[16] T. Liu and C. S. Lynch, "Orientation Dependence of Nonlinearity and Hysteresis in PZN-4.5% PT Single Crystals II: Bipolar Electromechanical Response," J. Intell. Mater. Syst. Struct, vol. 17, pp. 931-937, Oct. 1, 2006 2006.
[17] D. Lin, et al., "Electric-field and temperature induced phase transitions in Pb(Mg1/3Nb2/3)O3-0.3PbTiO3 single crystals," J. Appl. Phys., vol. 108, pp. 034112-4, 2010.
[18] Y. Lu, et al., "Phase transitional behavior and piezoelectric properties of the orthorhombic phase of Pb(Mg1/3Nb2/3)O3-PbTiO3 single crystals," Appl. Phys. Lett., vol. 78, pp. 3109-3111, 2001.
[19] T. Wu, et al., "Giant electric-field-induced reversible and permanent magnetization reorientation on magnetoelectric Ni/(011) [Pb(Mg1/3Nb2/3)O3](1-x)-[PbTiO3]x heterostructure," Appl. Phys. Lett, vol. 98, p. 012504, 2011.

SUMMARY

A ferroelectric device according to an embodiment of the current invention includes a first electrode, a second electrode spaced apart from the first electrode, and a ferroelectric element arranged between the first and second electrodes. The ferroelectric element has a plurality of quasistatic strain configurations that are selectable by the application of an electric field and the device has selectable electromechanical displacement by the application of the electric field.

A magneto-electric device according to an embodiment of the current invention includes a ferroelectric element, and a magnetic element coupled to the ferroelectric element. The ferroelectric element has a plurality of quasistatic strain configurations and a corresponding plurality of quasistatic dielectric values that are selectable by the application of an electric field, and the magnetic element is coupled to the ferroelectric element such that a change between quasistatic strain configurations causes a change in a preferred magnetization direction of the magnetic element.

A nonvolatile magnetic data storage device according to an embodiment of the current invention includes a plurality of electrically addressable magneto-electric elements, and a plurality of read elements corresponding to each of the plurality of electrically addressable magneto-electric elements. Each of the plurality of electrically addressable magneto-electric elements comprises a ferroelectric element and each of the ferroelectric elements has a plurality of quasistatic strain configurations and a corresponding plurality of quasistatic dielectric values that are selectable by the application of an electric field.

An electronic device according to an embodiment of the current invention includes a first circuit, a quasistatic variable capacitor selectively connectable to the first circuit to form a combined circuit, and a second circuit selectively connectable to the quasistatic variable capacitor. The quasistatic variable capacitor includes a first electrode, a second electrode spaced apart from the first electrode, and a ferroelectric element arranged between the first and second electrodes. The ferroelectric element has a plurality of quasistatic strain configurations and a corresponding plurality of quasistatic dielectric values that are selectable by the application of an electric field by the second circuit.

BRIEF DESCRIPTION OF THE DRAWINGS

Further objectives and advantages will become apparent from a consideration of the description, drawings, and examples.

FIG. 26A is a schematic illustration of a magnetoelectric memory element according to an embodiment of the current invention. FIG. 26B shows an SEM micrograph of 2000 nm ring structures.

DETAILED DESCRIPTION

Figure 1:
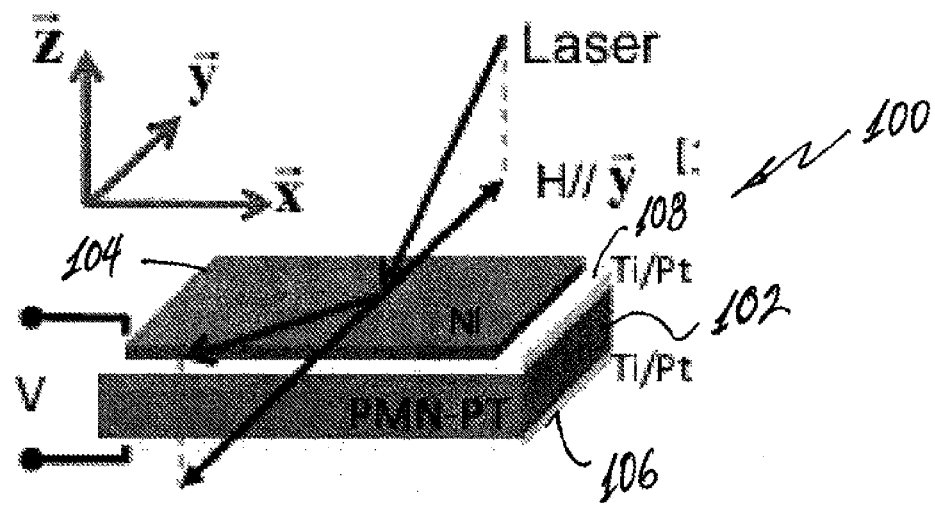
FIG. 1 is a schematic illustration of a magneto-electric device according to an embodiment of the current invention.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Some embodiments of this invention relate to tunable remnant ferroelectric properties of (011) oriented relaxor ferroelectric single crystals, and more particularly to the remnant strain and remnant permittivity of the (011) relaxor ferroelectrics. Current ferroelectric applications use the linear ferroelectric properties from a polarized state in sensor and actuator application. When an electric field is applied, the piezoelectric strain and permittivity change linearly with the applied electric field. Once the electric field is released, the ferroelectric returns to its initial state. Some embodiments of this invention are directed to a novel capability of electrical control of remnant properties in ferroelectrics, specifically in (011) oriented relaxor ferroelectrics. Applying and releasing an electric field in a specific regime results in permanent strain and permittivity changes (i.e. the strain and permittivity states remain after releasing the electric field). By applying an electric field of different amplitudes, it is possible to tune the permanent strain and permittivity within a wide range. This novel capability can be relevant for the design of transduction applications according to some embodiments of the current invention. In terms of energy, the remnant properties require no electrical energy to maintain the strain and permittivity states, which reduces power consumption.

In an embodiment of the present invention, the remnant strain can be achieved by applying an electric field pulse (i.e. applying and releasing the electric field) to an unpoled (011) relaxor ferroelectric element. The electric field is applied along [011] or [011] direction and its amplitude is larger than the ferroelectric coercive field of approximate 0.2 MV/m. This poling process along (011) direction results in a large remnant strain in the plane perpendicular to the (011) poling direction due to ferroelectric domain reorientation, particularly along the [011] or [011] direction. The remnant strain from unpoled to poled state is permanent after releasing the electric field.

In another embodiment of the present invention, the remnant strains can be tuned by applying an electric pulse opposite to the poled direction. The value of the remnant strain can be tuned over a wide range by changing the amplitude of applied electric pulse. The (011) relaxor ferroelectrics return to the initial remnant strain state (poled state) after applying an electric field pulse larger than the coercive field.

In another embodiment of the present invention, the remnant permittivity along the poling direction can be tuned by applying an electric pulse opposite to the polarized direction, similarly to the remnant strain. The remnant permittivity can be tuned over a wide range by changing the amplitude of applied electric pulse. The (011) relaxor ferroelectrics return to its initial permittivity (poled state) after applying an electric field pulse larger than the coercive field.

FIG. 1 is a schematic illustration of a magneto-electric device 100 according to an embodiment of the current invention. The magneto-electric device 100 includes a ferroelectric element 102 and a magnetic element 104 coupled to the ferroelectric element 102. The ferroelectric element 102 has a plurality of quasistatic strain configurations and a corresponding plurality of quasistatic dielectric values that are selectable by the application of an electric field. The magnetic element 104 is coupled to the ferroelectric element 102 such that a change between quasistatic strain configurations causes a change in a preferred magnetization direction of the magnetic element 104.

The terms "quasistatic strain configuration" and "quasistatic dielectric value" are intended to mean that the strain configuration and dielectric value remain substantially unchanged when the applied electric field is removed. In other words, when no power is applied, the ferroelectric elements can have one of two or more possible strain and dielectric values, depending on which strain configuration and dielectric value it has at the time of removal of the electric field, and they remain stable for time periods sufficient for the particular application. The term dielectric value is intended to include the dielectric constant or permittivity, for example.

The ferroelectric element 102 and/or magnetic element 104 can be layered structures, for example, such as, but not limited to, microstructures or nanostructures. However, the general concepts of the current invention are not limited to the particular sizes. The magnetic element 104 can be formed directly of the ferroelectric element 102, or it can have one or more layers of material therebetween. In the embodiment of FIG. 1, the magneto-electric device 100 also includes a first electrode 106 and a second electrode 108 spaced apart from the first electrode 106. The ferroelectric element 102 is arranged between the first electrode 106 and second electrode 108 such that an application of an electrical potential to provides an electric field for selecting a quasistatic strain configuration and a quasistatic dielectric value of the ferroelectric element 102. In the example of FIG. 1, the first electrode 106 and second electrode 108 are each bilayers of titanium and platinum. However, the broad concepts of the current invention are not limited to the particular materials illustrated in FIG. 1.

Figure 2:
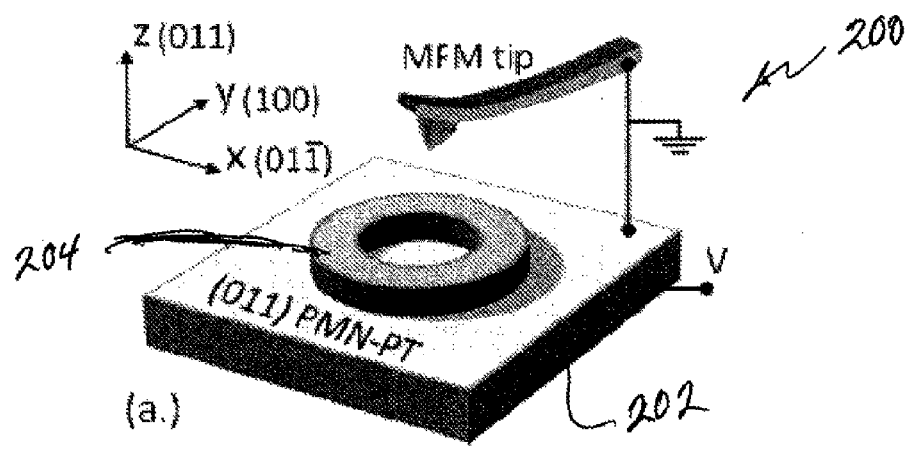
FIG. 2 is a schematic illustration of a magneto-electric device according to another embodiment of the current invention.

The magnetic element 104 can be formed from materials, have thicknesses and shapes selected according to the desired application. For example, the magnetic element 104 can be a substantially circular ring-shaped, disk-shaped, elliptical, spiral shaped, or a strip magnetic element. FIG. 2 is a schematic illustration of a magneto-electric device 200 according to another embodiment of the current invention. In this embodiment, a ring-shaped magnetic element 204 is coupled to the ferroelectric element 202.

Figure 3:
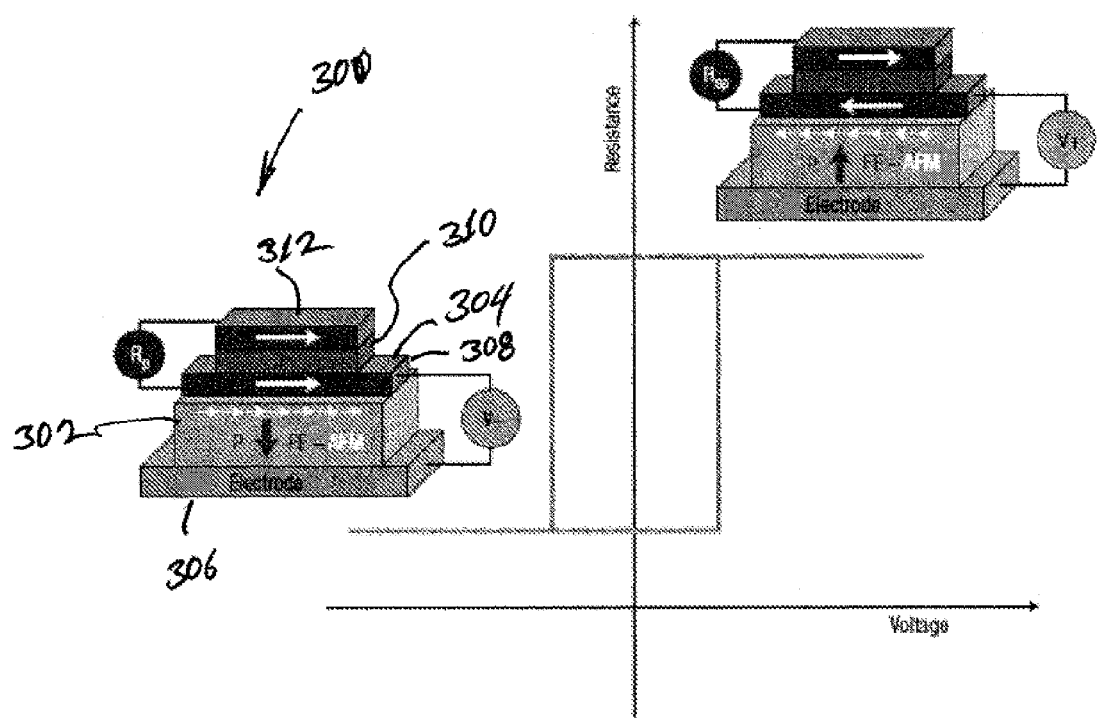
FIG. 3 is a schematic illustration of a magnetoelectric memory element according to an embodiment of the current invention.
Figure 4A:
FIGS. 4A-4D illustrate some concepts of a magnetoelectric memory element according to an embodiment of the current invention.
Figure 4B:
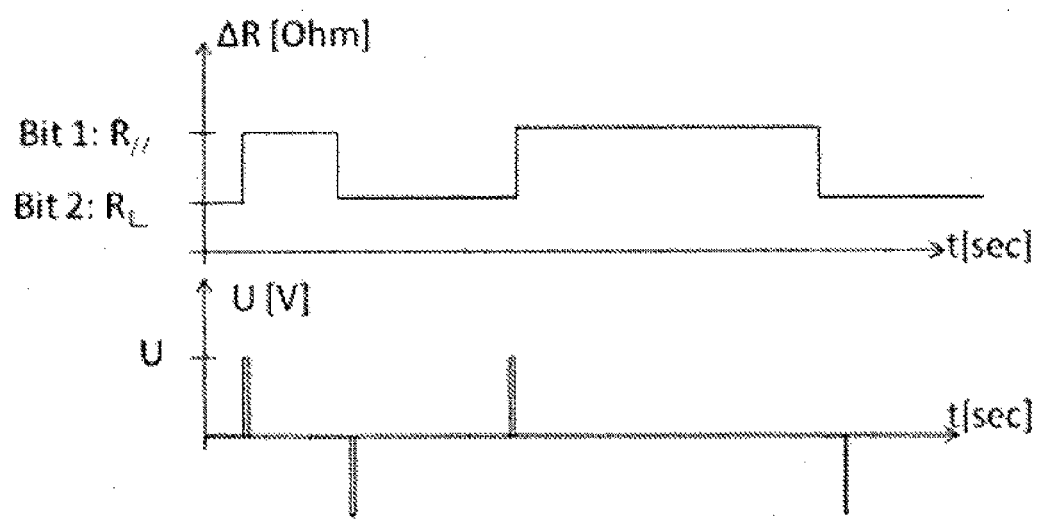
Figure 4C:
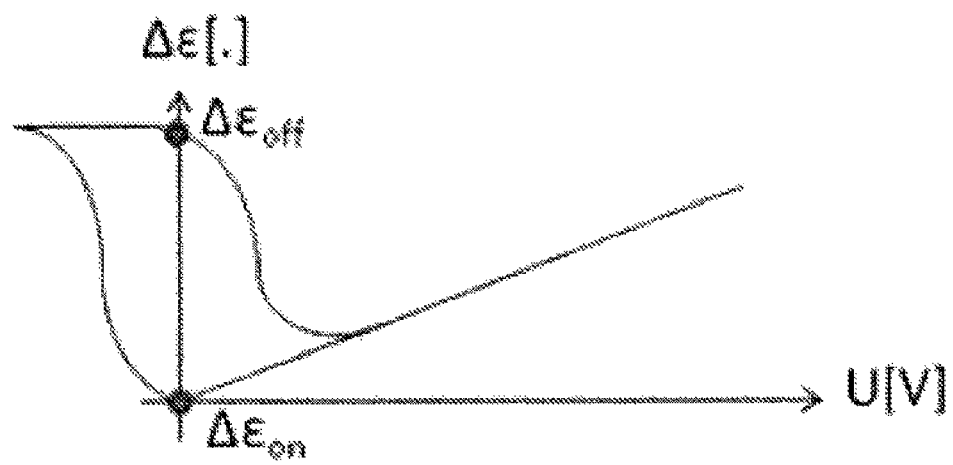
Figure 4D:
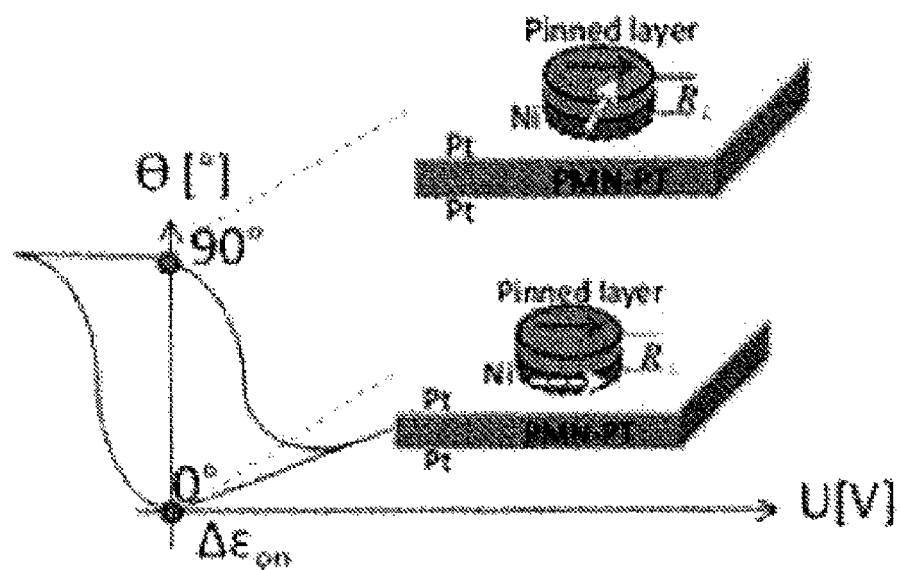

FIG. 3 is a schematic illustration of a magneto-electric device 300 according to another embodiment of the current invention. The magneto-electric device 300 includes a ferroelectric element 302 and a magnetic element 304 coupled to the ferroelectric element 302. The ferroelectric element 302 has a plurality of quasistatic strain configurations and a corresponding plurality of quasistatic dielectric values that are selectable by the application of an electric field. The magnetic element 304 is coupled to the ferroelectric element 302 such that a change between quasistatic strain configurations causes a change in a preferred magnetization direction of the magnetic element 304. The magneto-electric device 300 also includes a first electrode 306 and a second electrode 308 spaced apart from the first electrode 306. The ferroelectric element 302 is arranged between the first electrode 306 and second electrode 308 such that an application of an electrical potential to provides an electric field for selecting a quasistatic strain configuration and a quasistatic dielectric value of the ferroelectric element 302.

The magneto-electric device 300 further includes a tunneling barrier 310 formed on the magnetic element 304 and a reference magnetic element 312 formed on the tunneling barrier 310. The magnetic element 304 and the reference magnetic element 312 are adapted to be electrically connected in a circuit to provide a magnetic tunnel junction circuit such that the magneto-electric device 300 is a nonvolatile magnetic data storage device having at least one writeable and readable element. The left and right hand sides of FIG. 3 illustrate two states of a one-bit binary element. In some embodiments, a plurality of such elements can be connected in series and/or parallel. For example, an array of such structures can be provided according to an embodiment of the current invention. FIGS. 4A-4D further illustrate concepts of a data storage device according to an embodiment of the current invention. The term "data storage device" is intended to include both data storage and memory devices.

The ferroelectric element 102, 202, 302 can be a crystalline relaxor ferroelectric having a selected crystal orientation according to some embodiments of the current invention. In some embodiments, the ferroelectric element 102, 202, 302 can be a crystalline relaxor ferroelectric satisfying the following

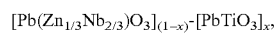

wherein x is greater than 0.0 and less than about 0.1.

In some embodiments, the ferroelectric element 102, 202, 302 can be a crystalline relaxor ferroelectric satisfying the following

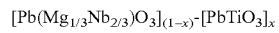

wherein x is greater than 0.30 and less than about 0.35. In some embodiments, x is about 0.32. The term "about" means ±10%. Although these materials have been found to be suitable for some applications of the current invention, the broad concepts of the current invention are not limited to these particular examples. Other materials can be used as long as they exhibit sufficient quasistatic behavior for the particular application.

Figure 5:
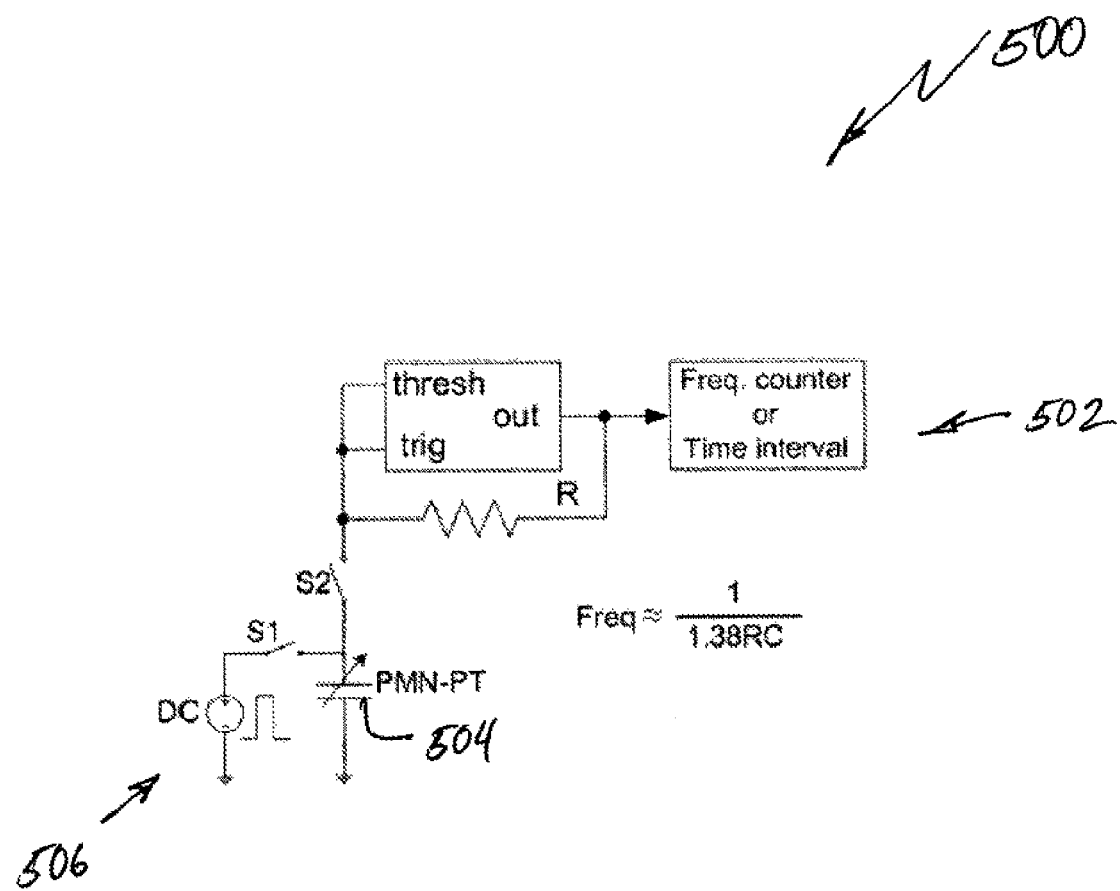
FIG. 5 is a schematic illustration of an electronic device according to another embodiment.

FIG. 5 is a schematic illustration of an electronic device 500 according to another embodiment. The electronic device 500 includes a first circuit 502, a quasistatic variable capacitor 504 selectively connectable to the first circuit 502 to form a combined circuit, and a second circuit 506 selectively connectable to the quasistatic variable capacitor 504. The quasistatic variable capacitor 504 a first electrode, a second electrode spaced apart from the first electrode, and a ferroelectric element arranged between the first and second electrodes. This can be similar to, or the same as, the portions of the structures illustrated in FIGS. 1-4D in which a ferroelectric element is arranged between two electrodes, for example.

The following examples are provided to help explain further concepts and details of some embodiments of the current invention. Some particular applications are also described. However, the general concepts of the current invention are not limited to the particular applications and examples.

EXAMPLE 1

Considerable work has been conducted on ferroelectric materials over the last serveral decades. More recently, a large research focus has been on studying single crystal ferroelectrics that provide fairly unique behavior as compared to ceramic ferroelectrics. One phenomenon that has received relatively little attention in single crystal materials is the control of remnant strain states through the application of an electric field. This could be extremely useful in magnetoelectric (ME) heterostructures proposed for non-volatile memory devices[1-3]. ME heterostructures have attracted substantial attention due to the strong coupling between ferroelectric and ferromagnetic phases.[4-8] However, one of the main problems with the various applications[9-18]_ENREF_7_ENREF_11 is the ability to develop a specific remnant strain (i.e. at zero electric field) that reorients the magnetic dipole.

Single crystal relaxor ferroelectrics, such as [Pb(Zn$_{1/3}$Nb$_{2/3}$)O$_3$]$_{(1-x)}$-[PbTiO$_3$]$_x$(PZN-xPT, 0<x<0.1) and [Pb(Mg$_{1/3}$Nb$_{2/3}$)O3]$_{(1-x)}$-[PbTiO$_3$]$_x$(PMN-xPT, 0<x<0.35), exhibit unique dielectric and electromechanical properties.[19,20] Previous studies focused on mapping the phase-composition diagram,[21-23] temperature dependence[24-30] electric field or stress induced phase transitions[31-38] and modeling[39-41] to better understand the crystal performance. Recently, Wu et al.[42] reported that (011) cut and poled PMN-xPT (x≈0.32) single crystal material exhibits a giant strain jump during the electric field driven polarization reorientation process and two reversible and permanent strain states can be achieved by applying the proper electric field. Such giant strain hysteresis with tunable remnant strain properties of the relaxor PMN-PT single crystal ferroelectric substrate are used to achieve reversible and permanent magnetization rotation.[42]

In this example, a more detailed characterization of the ferroelectric properties is presented with a specific focus on the ability to control the giant nonlinear and hysteretic strain behavior of (011) PMN-PT single crystals with an electric field. This process is capable of producing relatively large changes in remnant strain by simply applying and releasing an electric field. Thus the strain can be altered without a continuous electric field being applied, which requires energy. This is potentially useful in many applications.

EXPERIMENTAL

Specimen Preparation

The (011) PMN-PT single crystal ferroelectrics were manufactured and prepared by Atom Optics CO., LTD (Shanghai, China) using the Bridgeman growth method. The percentage of the TiO$_2$ powder in the mixture is approximately 32%. In this example two specimens were utilized with dimensions of either 20×10×0.5 mm$^3$ or 7×5×0.5 mm$^3$ with <011> orientation along the thickness, i.e. perpendicular to the large surface. Both surfaces were polished and provide a surface roughness less than 30 Å. A 10 nm Ti and a 100 nm Pt layers were evaporated on both sides as surface electrodes.

Characterization

The crystal structure of PMN-PT substrate was determined using a single crystal X-ray diffractometer (Bruker Smart 1000 Apex 11) with a monochromated Mo Kα source and an X-ray powder diffractometer (XRD, Panalytical X'Pert Pro) with a Cu Kα source. The dielectric properties were measured on the 7×5×0.5 mm$^3$ specimens using HP4274A LCR meter under multiple frequencies and electric voltage bias conditions. The in-plane piezoelectric response (ϵ-E) was measured by mounting a biaxial strain gauge (L2A-06-062LT-350, Micro-Measurements) on the 20×10×0.5 mm$^3$ sample surface. And the electric displacement (D-E loop) was characterized on both small and large specimens using a modified Sawyer-Tower circuit. A triangle waveform electric field was applied using a function generator followed by a high voltage power amplifier for ϵ-E and D-E measurements. The frequency was 0.01 Hz and data was gathered using a digital data acquisition system.

Results and Discussion

X-ray Diffraction (XRD) Analysis

Figure 6:
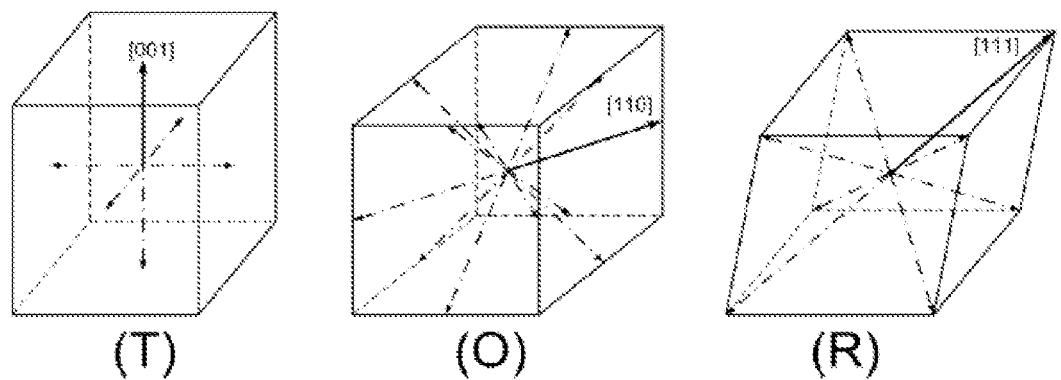
FIG. 6 illustrates three basic crystal structures and possible spontaneous polarizations for different phases: the tetragonal (T) phase, orthorhombic (O) and rhombohedral (R) phases

The electromechanical properties of single crystal ferroelectrics mainly depend on their crystal structure, orientation and domain states. FIG. 6 shows that the tetragonal (T) phase has 6 equivalent spontaneous polarization directions along <100> orientations, while the orthorhombic (O) and rhombohedral (R) phases have 12 and 8 spontaneous polarizations along <110> and <111> orientations, respectively. Several researchers have confirmed that three monoclinic phases (M) and the coexistence of R, M, O or T phases may be observed in the morphotropic phase boundary (MPB)[23,43-45], and these relaxor single crystals exhibit large piezoelectric coefficients in MPB region. It has been postulated that the coexistence of multiple phases and phase instability are key phenomena contributing to the unique crystal properties. Although the coexistence of multiple phases represents a complex issue and ongoing discussion in the research community, the ferroelectric response can be described in the context of individual crystal polarization variants within a single phase structure. For example, the response of a (100) oriented and poled rhombohedral crystal can be described with the use of a four variant system that produces isotropic in-plane piezoelectric response with high electromechanical coupling coefficient while the (011) oriented and poled crystal can be described with a two variant system producing an anisotropic in-plane piezoelectric response.

To determine the crystal structure of PMN-PT specimens used in this study, single crystal XRD measurements were performed to calculate the lattice constants. The characterization data indicates that the most plausible unit cell structure was either cubic or rhombohedral. Based on the PMN-PT phase diagram, the cubic structure is only present above 150° C.[35] Therefore, the specimens used in this study mainly consisted of rhombohedral unit cells with a surface orientation of either [011] or [01$\bar{1}$].

Figure 7:
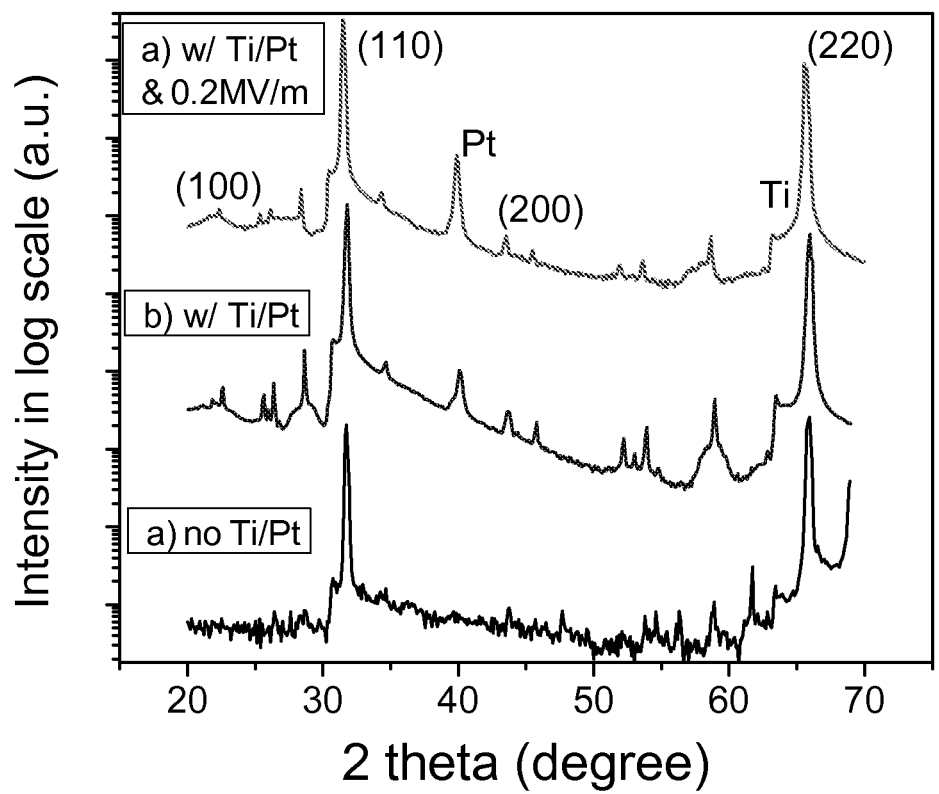
FIG. 7 shows X-ray Diffraction (XRD) analysis of PMN-PT substrates under three cases: a) PMN-PT substrate only without Ti/Pt electrodes; b) PMN-PT with Ti/Pt electrode but not poled; c) PMN-PT substrate with Ti/Pt electrodes and poled at 0.2 MV/m

To further confirm the crystal orientation and study the influence of applied electric field, the XRD patterns were characterized for three cases: a) PMN-PT substrate only without Ti/Pt electrodes; b) PMN-PT with Ti/Pt electrode but not poled; c) PMN-PT substrate with Ti/Pt electrodes and applied with an electric field of 0.2 MV/m. As shown in FIG. 7, all three diffraction patterns exhibit significant (110) and (220) phase peaks of the PMN-PT substrate, which confirms the crystal orientation. Comparing the unpoled and poled cases, no shift was observed on (110) and (220) peaks, indicating that a phase transformation does not occur at these voltages.[34] _ENREF_23

The XRD data confirms that the rhombohedral phase is the main crystal structure of the (011) PMN-PT ferroelectric material. The configuration of the sample and its orientation relative to the rhombohedral unit cell are shown in FIG. 8. The coordinate system depicted in this figure shows two possible <111> variants, [$\bar{1}$11] and [111] in the [011] cut and poled rhombohedral unit cell. These together with the in-plane variants are used to explain the observed ferroelectric switching properties of the (011) PMN-PT material.

Full Range Electric Displacement (D) vs. Electric Field (E)

Figure 8A:
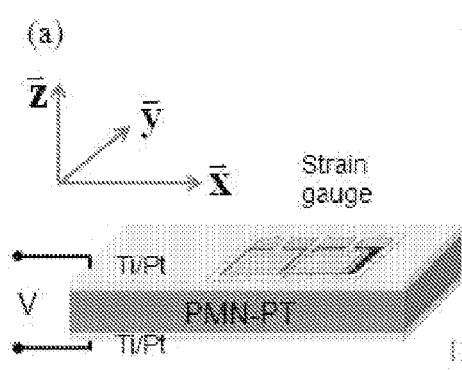
FIG. 8A shows sample configuration and coordinates according to an embodiment of the current invention.
Figure 8B:
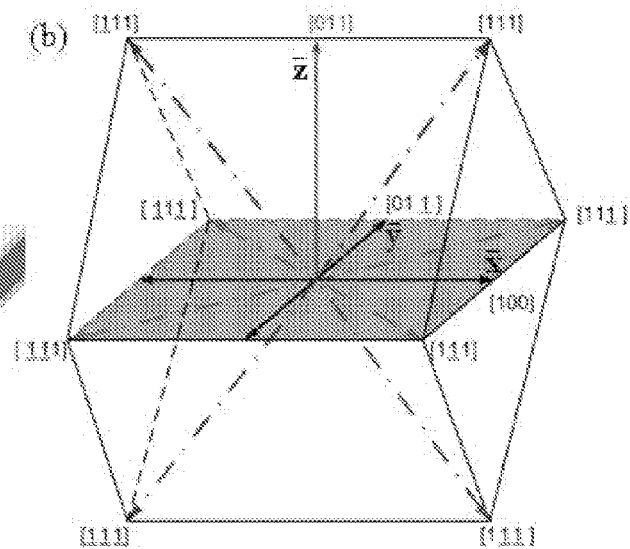
FIG. 8B shows rhombohedral unit cell with 8 possible <111> polarization variants.
Figure 9:
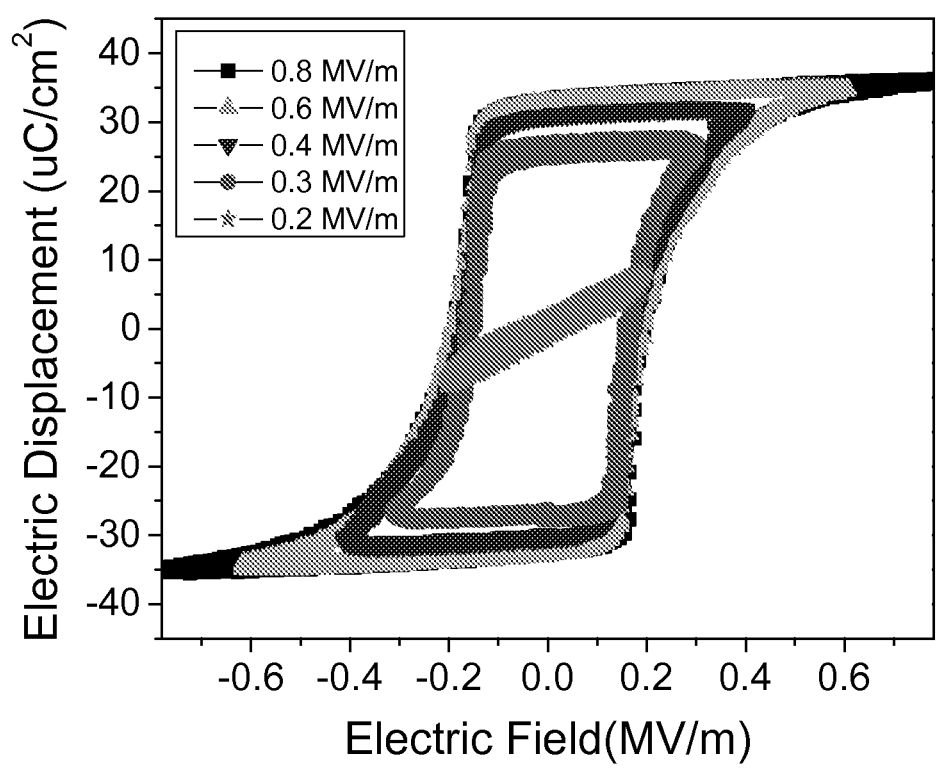
FIG. 9 shows electric displacement D as a function of applied electric field E under different bipolar electric field ranges according to an embodiment of the current invention.

FIG. 9 shows the electric displacement D as a function of applied electric field E (D-E loop). The maximum bipolar electric voltages are gradually increased from 0 to 0.8 MV/m. The unpoled PMN-PT exhibits linear but small electric displacement below the coercive field $E_c$ 0.2 MV/m. As the field magnitude is increased, the PMN-PT shows a D-E hysteresis loop with large saturation and remnant polarizations. However, the magnitudes of the saturation and remnant polarization depend on the maximum applied electric field. As shown in FIG. 4, the DE curves at 0.8 MV/m and 0.6 MV/m bipolar electric fields show a saturation polarization of ~35 μC/cm$^2$ and a remnant polarization of ~32 μC/cm$^2$, respectively. This is contrasted with a 0.3 MV/m electric field producing a reduced saturation and remnant polarization of ~27 μC/cm$^2$. The large remnant polarization is described using the rhombohedral unit cell model of FIG. 8. Once the PMN-PT is fully poled along the (011) direction, all the polarizations are aligned to the [111] and [$\bar{1}$11] variants, which have a large vector component when projected in the (011) direction. Therefore, a large remnant polarization is present. When the electric field is reversed, the polarization switches to the [$\bar{1}$1$\bar{1}$] and the [1$\bar{1}\bar{1}$] variants. The coercive field also shifts slightly under different bipolar electric fields. The electric field induced variations in remnant polarization and coercive field are related to the activation energy required for polarization reorientation. This may be a function of ferroelectric domain nucleation and growth, or possibly a domain locking mechanism. However, the current invention is not limited to an identification of the mechanism.

Dielectric Constant and Loss

Figure 10:
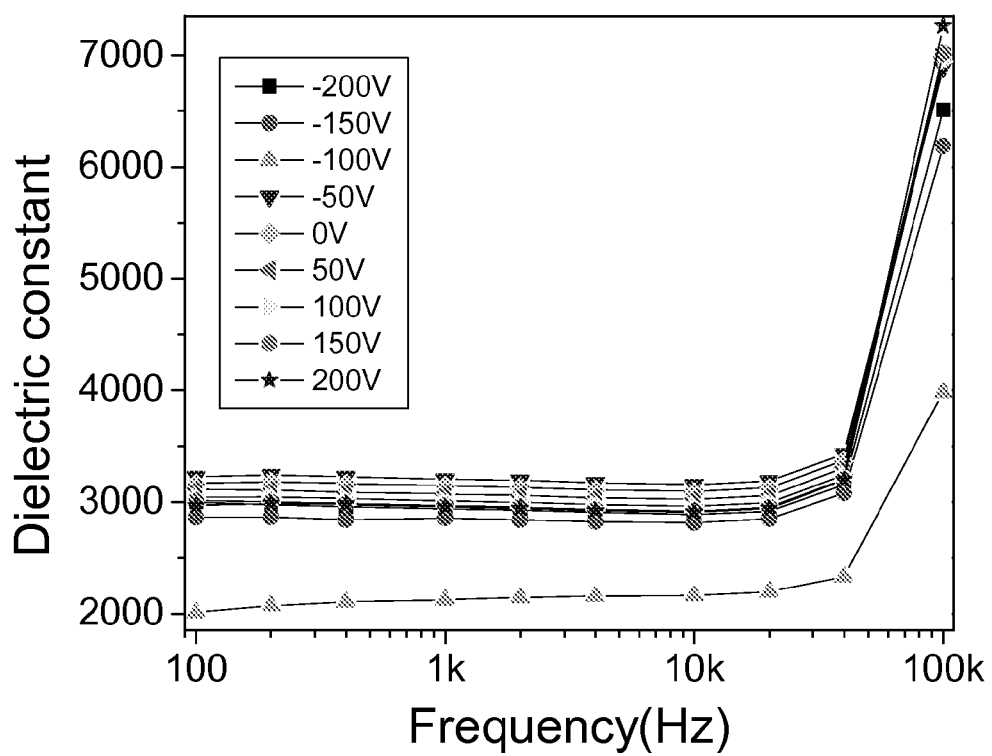
FIG. 10 shows dielectric constant as a function of frequency under different electric voltage bias according to an embodiment of the current invention.
Figure 11:
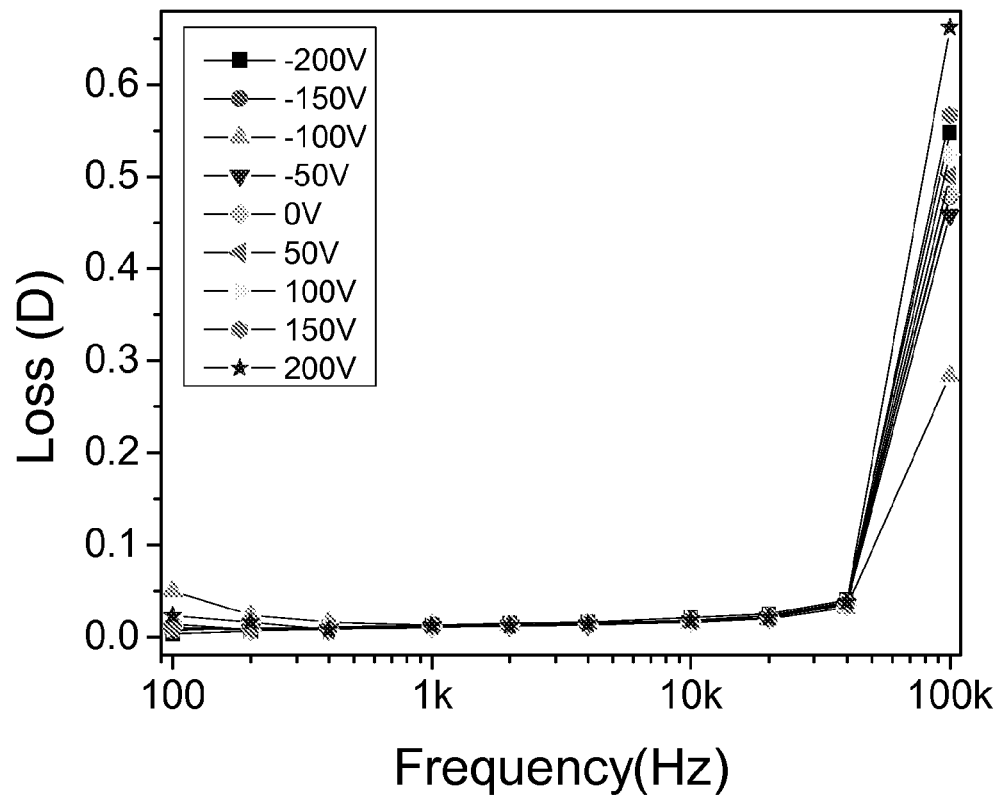
FIG. 11 shows dielectric loss as a function of frequency under different electric voltage bias according to an embodiment of the current invention.

FIGS. 10 and 11 show the dielectric constant and loss as a function of frequency under different electric voltage bias conditions. Two sizes of samples were tested and both results show certain electric field and frequency dependence. The −100 V electric voltage bias on the 0.5 mm thick positively poled specimen represents −0.2 MV/m. This is seen from FIG. 9 to be the coercive field. The dielectric constant is significantly lower than under other bias conditions, which is due to the depolarization of the PMN-PT material. Under other voltage biases, the dielectric constant ranges from 2800 to 3300 at a measured frequency lower than 100 kHz. The dielectric constant jumps to over 6000 at a frequency of 100 kHz. This frequency is close the resonant frequency. The dielectric loss value is typically around 0.02~0.03 with a small variation below 10 kHz, but dramatically increases when approaching the resonant frequency.

Capacitance-Voltage sweep

Figure 12A:
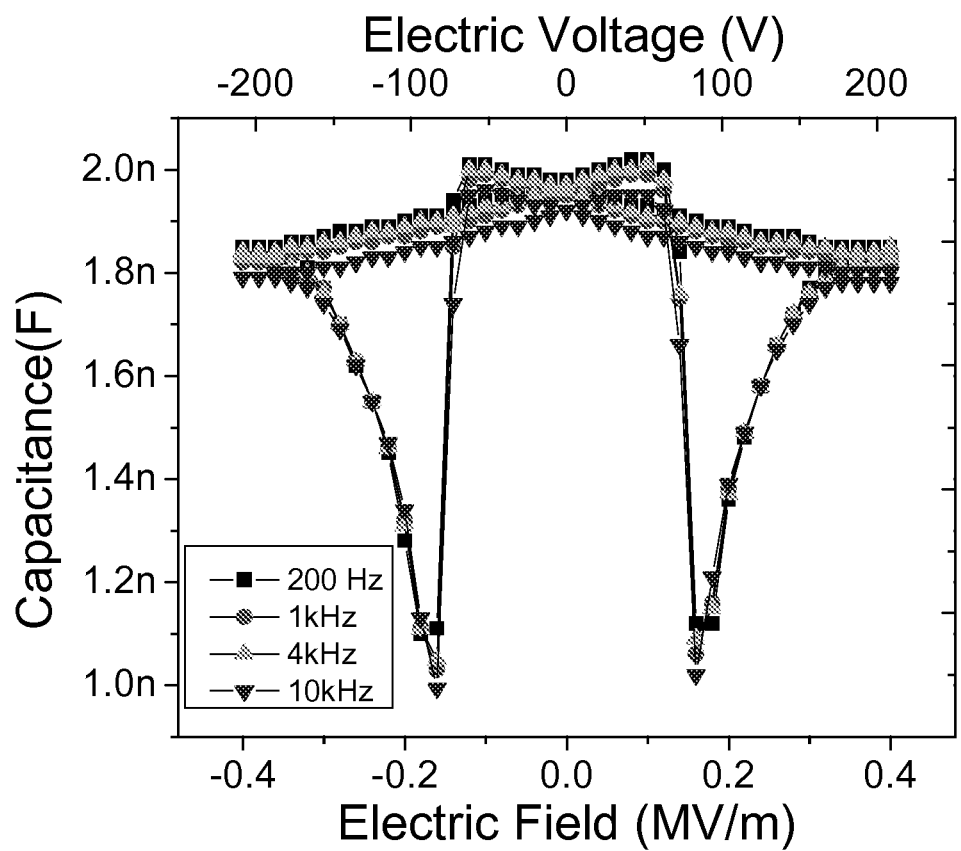
FIG. 12A shows Capacitance-Voltage (C-V) sweep characteristics at ac frequencies of 200 Hz, 1 kHz, 4 kHz and 10 kHz according to an embodiment of the current invention.

A capacitance-voltage (C-V) sweep was performed at several frequencies using a 7×5×0.5 mm$^3$ specimen. FIG. 12A shows the C-V sweep characteristics at the frequencies of 200 Hz, 1 kHz, 4 kHz and 10 kHz, respectively. The four curves almost overlap and the capacitance measured at 10 kHz is slightly smaller than other frequencies, which is in agreement with the results in FIG. 11. However, two significant jumps can be observed in each curve near the coercive field 0.2 MV/m. Following the sweeping direction from the positive side, the capacitance first increases linearly and approaches a maximum value at around −0.14 MV/m. Then the capacitance value drops significantly and returns after the PMN-PT is repoled under high negative fields. After repolarization, the capacitance follows a similar trend and undergoes another drop near 0.14 MV/m. These two jumps near the coercive field are consistent with the decrease of dielectric constant at this field level seen in FIG. 11.

In addition to the full range C-V sweep, if the applied electric field is reversed near the critical electric field Ecr, multiple remnant capacitance can be obtained. Therefore, the material has a tunable remnant permittivity property. This is directly related with tunable remnant strain, which will be discussed in following section.

Piezoelectric Property

Since the low-field piezoelectric strain property of PMN-PT is of particular interest and importance in the ME heterostructure, ϵ-E characterization was performed in atmosphere with electric fields of no more than 1 MV/m. 6 specimens (20×10×0.5 mm$^3$) were characterized with the same type of biaxial strain gauge and measurement instruments. There exists certain variations in the strain values from sample to sample; however, the general trend and piezoelectric properties remain consistent. In the following sections, the most common results are reported and the variation between the measurements is addressed.

Full Bipolar Loop

Figure 12B:
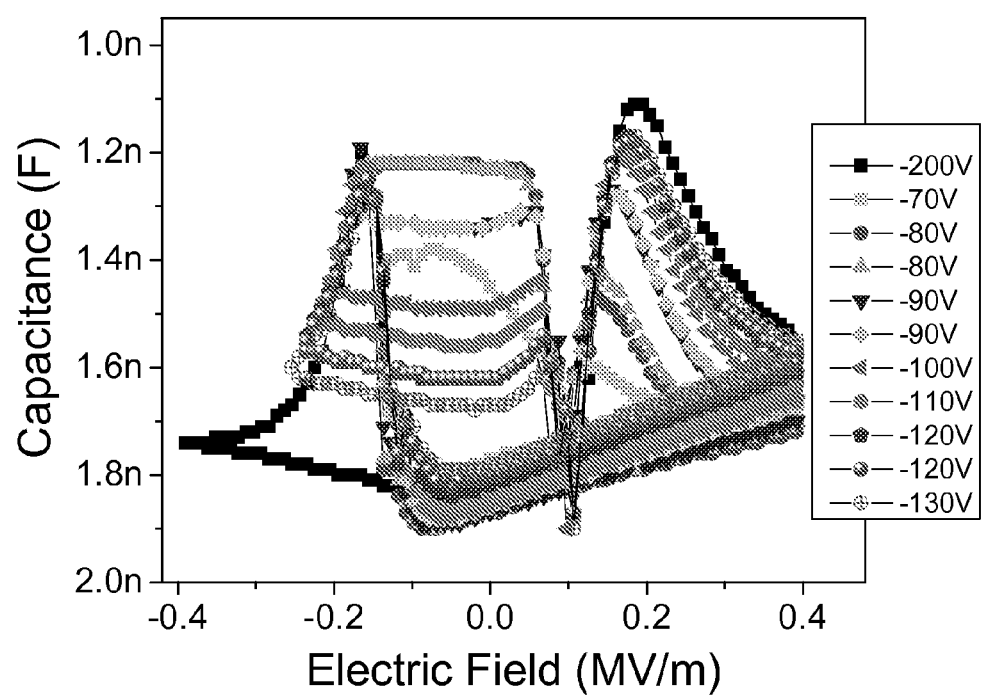
FIG. 12B shows tunable remnant capacitance at 1 kHz according to an embodiment of the current invention.
Figure 13A:
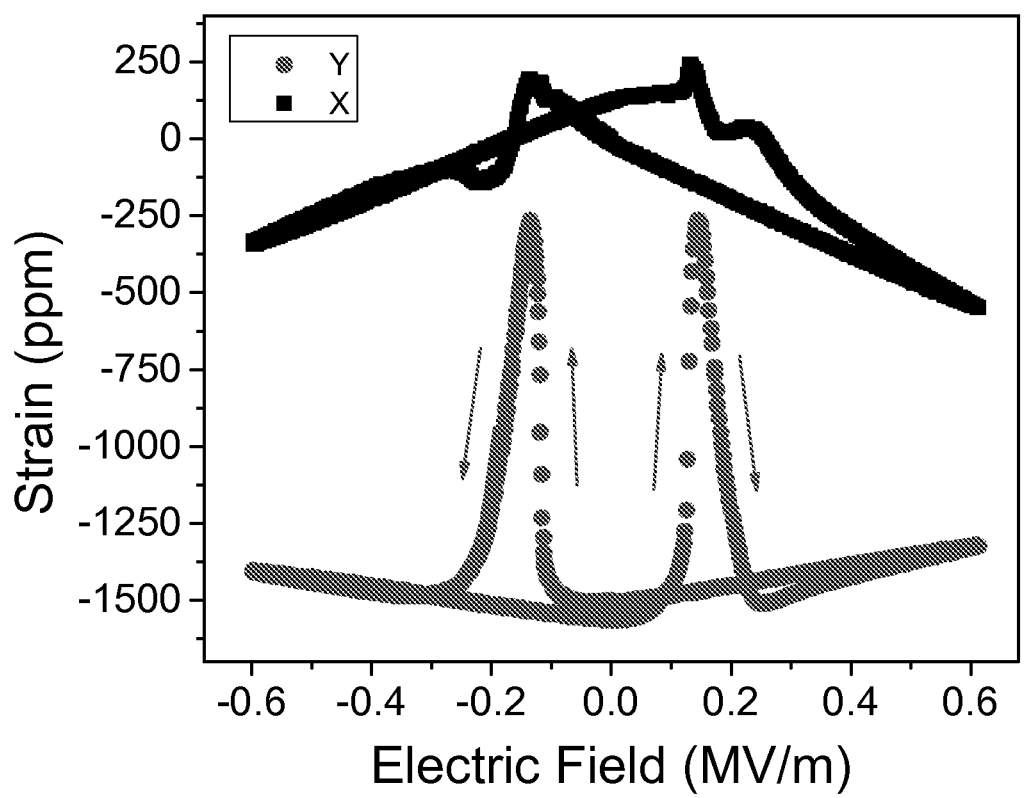
FIG. 13A shows full piezoelectric strain response ϵ-E of one (011) PMN-PT sample piezoelectric strain along $\vec{x}$ and $\vec{y}$ and (FIG. 13B) derived piezoelectric strain along direction measured and data based on volume conservation.

FIG. 13 shows the piezoelectric response measured by cycling triangle electric fields within ±0.6 MV/m at a frequency of 0.01 Hz. The strains were measured along both $\vec{x}$ and $\vec{y}$ directions and the zero reference was set from an unpoled state. The (011) PMN-PT has a linear anisotropic piezoelectric response along the poled direction and a large remnant strain was present along the $\vec{y}$ direction. However, when a negative electric field was applied to depolarize or repolarize the material, a giant strain jump occurred near the coercive field −0.2 MV (i.e. 1000 ppm peak was present along the $\vec{y}$ direction), which was also indicated in the C-V sweep characteristic in FIG. 12.

When a positive electric field was applied to the positively poled material, a positive strain was measured in the $\vec{y}$ direction and a negative strain component was measured in the $\vec{x}$ direction. This corresponds to a positive $d_{32}$ and a negative $d_{31}$. The measured piezoelectric properties (the slopes of the strain vs. electric field curves in the linear region) are explained in terms of polarization rotation according to the rhombohedral crystal structure shown in FIG. 8B.[42] For specimens poled along the [011] direction, the polarizations are aligned along the two [$\bar{1}$11] and [111] variants. The projection of the polarization of these two variants on the x-y plane lies in the $\vec{x}$ direction. Application of a positive electric field rotates these two variants toward the $\vec{z}$ direction. This induces a contraction along $\vec{x}$ and an extension along $\vec{y}$. The extension along $\vec{y}$ may be the result of some rotation of the polarization about the z-axis such that a component of the polarization projected onto the x-y plane develops a y-component under applied field.

When a negative electric field smaller than the coercive field $E_c$ is applied ($-E_c$<E<0 MV/m), the polarizations first rotate from two out-of-plane <111> directions to four possible in-plane <111> directions. Each in-plane <111> variant has a projected component along the $\vec{y}$ direction. Therefore, this non-180° polarization reorientation produces a large jump in the strain along the $\vec{y}$ direction. By further increasing the negative electric field (E<−$E_c$), the polarizations undergo another non-180° polarization reorientation from in-plane to the other two [1$\bar{1}\bar{1}$] and [$\bar{1}$1$\bar{1}$] polarization variants. Accordingly, the strain along the $\vec{y}$ direction jumps back to a normal poled piezoelectric response. When the electric field is swept from negative to positive, similar piezoelectric behavior with another strain jump can also be observed near the positive coercive field.

Figure 13B:
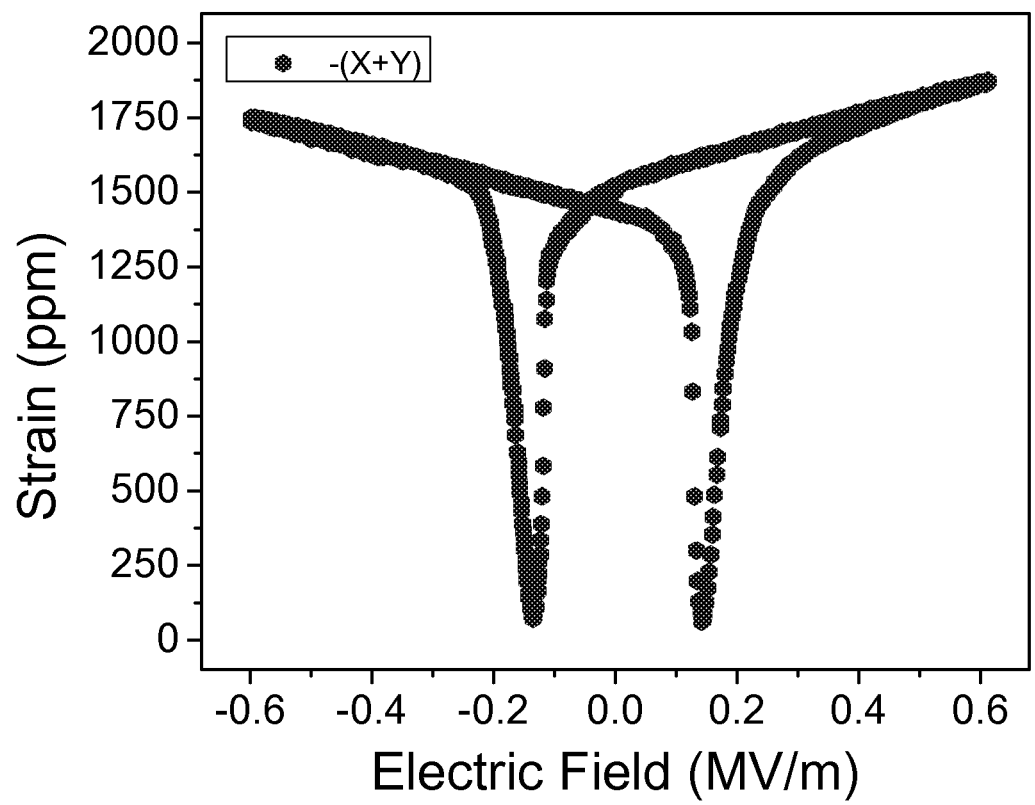

An assumed constant volume process of polarization reorientation allows calculation of the strain along the $\vec{z}$ direction (i.e. out-of-plane [011] direction) from the summation of measured strains along $\vec{x}$ and $\vec{y}$. FIG. 13B shows the calculated strain as a function of applied electric field. These curves show similar trends to other literature.[35]

The critical electric field $E_{cr}$, where the strain jump peak occurs, may vary depending on the specific sample. The values observed for $E_{cr}$ are between 0.12 MV/m and 0.16 MV/m. Also the poling induced remnant strain and maximum jumping strain along the $\vec{y}$ direction differ from sample to sample. Most specimens tested had a poling induced remanent strain between 1300~1500 ppm and the jumping strain around 1200~1300 ppm (see FIG. 13A). The maximum remnant strain observed in these tests was 1800 ppm and the corresponding jumping strain was around 1500 ppm (see FIG. 14A). For the strain along the $\vec{x}$ direction, there is no clear conclusion since the strain response is quite random. This may be due to the random in-plane polarization alignment of variants during the non-180° polarization reorientation process.

Giant Strain Hysteresis With Two Reversible Remnant Strain States

Figure 14A:
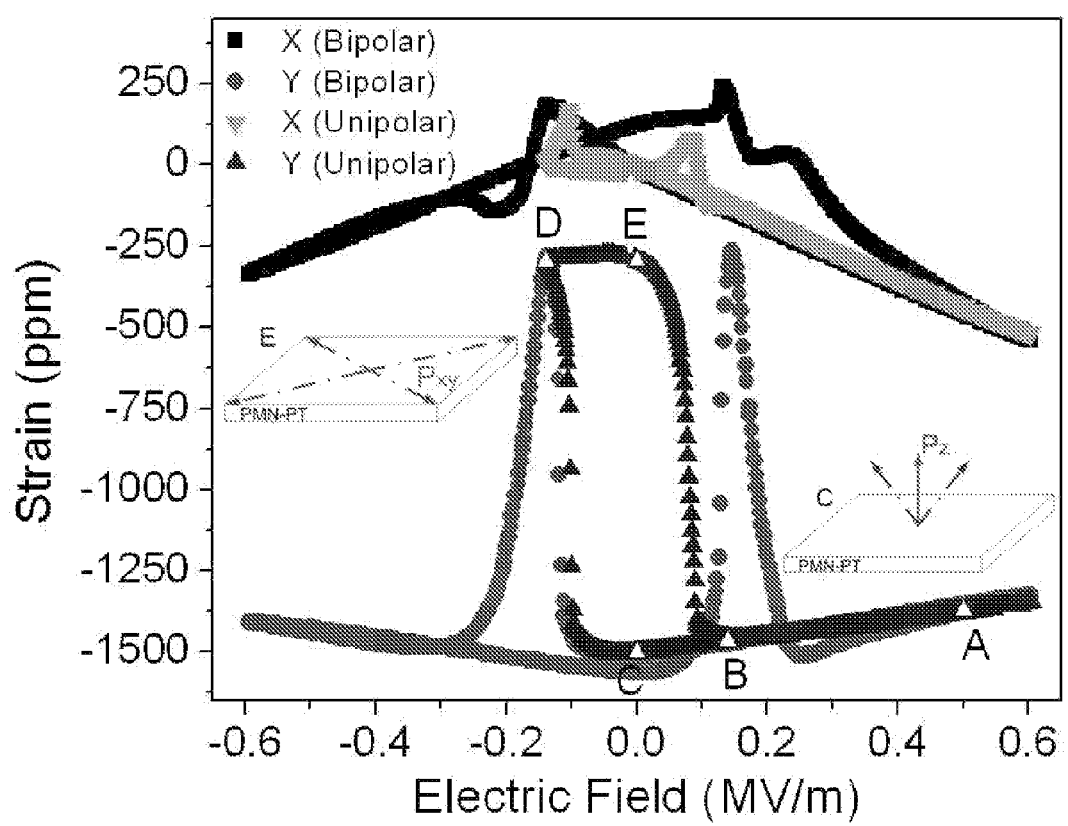
FIG. 14A shows in-plane piezoelectric strain value along $\vec{x}$ and $\vec{y}$ directions.

By operating in the vicinity of the critical field $E_{cr}$, it is possible to take advantage of the first non-180° polarization reorientation to produce two reversible and permanent remnant strain states having significantly different strain values. FIG. 14A shows both the bipolar and unipolar strain curves along $\vec{x}$ and $\vec{y}$ as a function of applied electric field. The bipolar curves are similar to FIG. 13A. The unipolar electric field was cycled between −0.14 MV/m (i.e. near $E_{cr}$) and 0.6 MV/m. Both unipolar $\vec{x}$ and $\vec{y}$ curves consist of two distinct strain responses: a linear piezoelectric response (A-B-C) and a nonlinear hysteretic response (C-D-E-B-C). Operating in the linear region, the PMN-PT substrate exhibits highly anisotropic behavior. The piezoelectric coefficients are approximately −890 pC/N along $\vec{x}$ and +290 pC/N along $\vec{y}$, respectively.

The nonlinear region exhibits a hysteretic property along the $\vec{y}$ direction with two reversible and stable remnant strain states. The remnant strain in the $\vec{x}$ direction is near zero, whereas the remnant strain in the $\vec{y}$ direction is large and negative as seen in FIG. 8A. Electrically depoling the material with a reverse electric field that is insufficient to fully reverse the polarization can reset the remnant strain in the $\vec{x}$ direction to a near zero state. Electric field can thus be used to switch the remnant strain state in the $\vec{y}$ direction without changing the remnant strain state in the $\vec{x}$ directions. This behavior is demonstrated in FIG. 14. When a negative electric field is applied from 0 to $E_{cr}$ (point C to point D), the strain response follows the bipolar strain curve with a large nonlinear strain jump at point D. This corresponds to the first non-180° polarization reorientation mentioned above. Releasing the electric field at $E_{cr}$ provides a stable large remnant strain of over +1200 ppm along $\vec{y}$ (point E), while a small remnant strain is present along $\vec{x}$. At point E, the polarizations are mainly aligned along the in-plane <111> variants, as shown in FIG. 6. When a positive electric field is applied from 0 to +0.14 MV/m (point E to point B), the strain response jumps back to the original linear path (A-B-C). Here, when the electric field is removed, the remnant strain vanishes and the polarizations are mainly aligned along the out-of-plane <111> variants. Thus the non-180° polarization reorientation has been used to produce two reversible and permanent remnant strain states having significantly different strain values at E=0 MV/m.

Figure 14B:
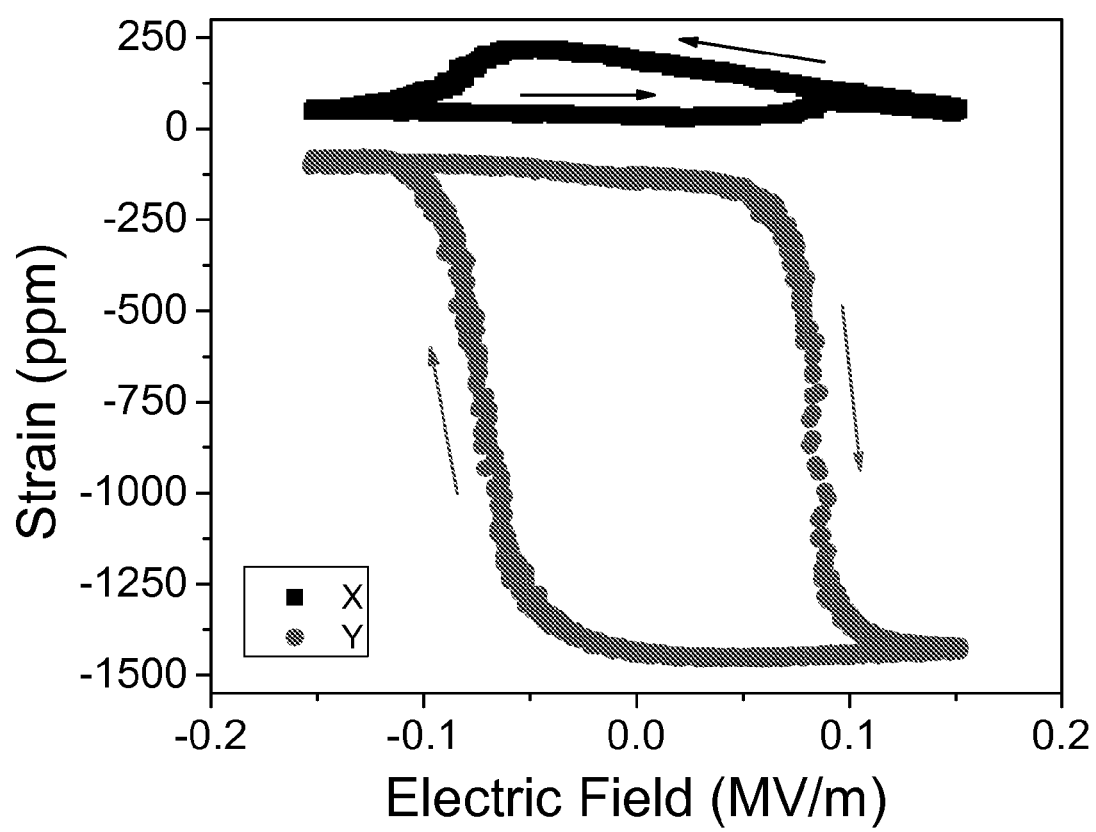
FIG. 14B strain hysteresis from positively poled state, and FIG. 14C strain hysteresis from negatively poled state according to an embodiment of the current invention.
Figure 14C:
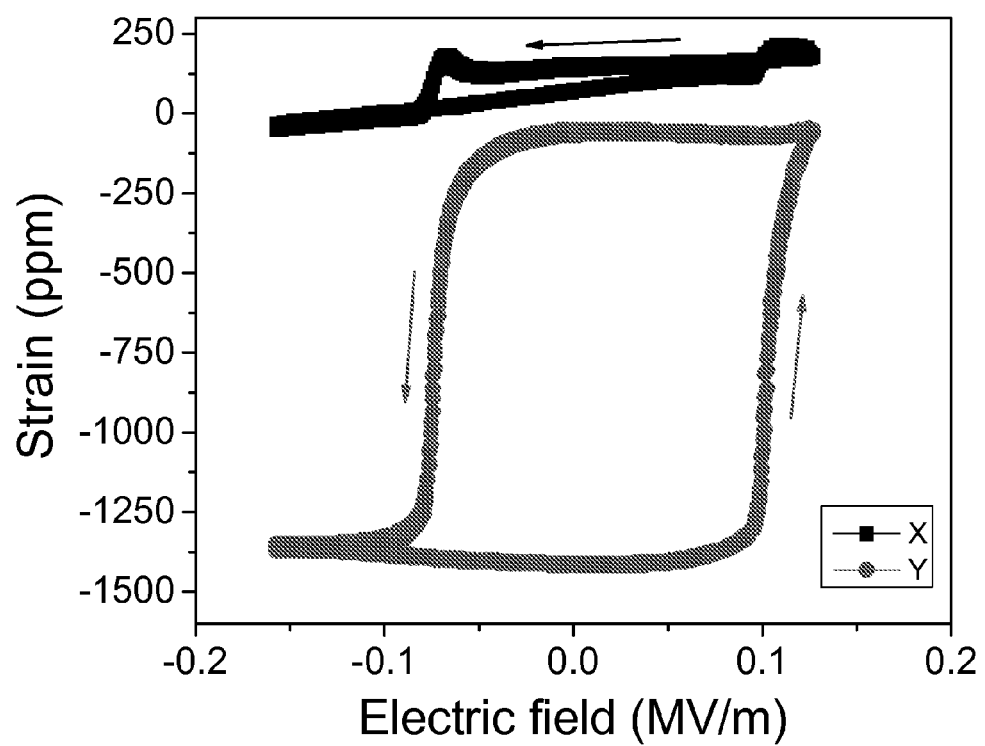

By properly choosing the reversing electric field, this giant strain hysteresis can be achieved regardless of the poling direction. FIGS. 14B and 14C show strain hysteresis curves obtained from both positively poled and negatively poled cases. It is important to note that the strain hysteresis loop (C-D-E-B-C) in FIG. 14A is highly repeatable and stable without reductions in remnant strains.

Tunable Remnant Strains

Figure 15:
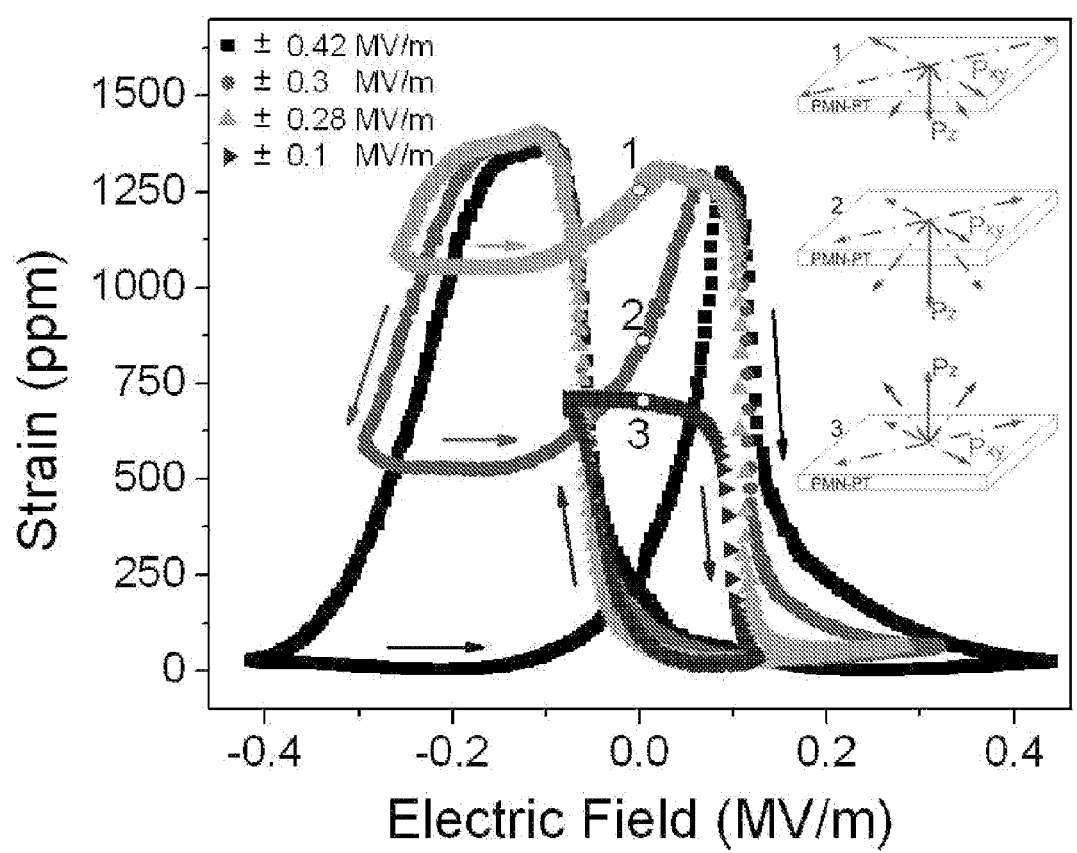
FIG. 15 shows piezoelectric strain response of (011) PMN-PT along $\vec{y}$ direction under different bipolar sweeping electric fields according to an embodiment of the current invention. The piezoelectric strain data was recorded from a fully polarized state in the direction. The drawings show the sample configuration. The arrows indicate the directions of the bipolar electric fields.

Instead of reversing the electric field at $E_{cr}$ tunable remnant strains can be achieved by varying the reversing electric field. FIG. 15 provides experimental piezoelectric strain data versus different bipolar electric fields ($\epsilon$-E) with strain measured along the $\vec{y}$ direction. Since the strain response is relatively small along the $\vec{x}$ direction, only the strain value along the $\vec{y}$ direction is plotted and all the data was recorded from a fully polarized state in the $\vec{z}$ direction (i.e. the offset of poling induced remnant strain is removed). Similar to full range bipolar curve, two giant strain jump peaks are shown in the ±0.42 MV/m curve. However, if the reversing electric field is larger than $E_{cr}$, a larger driving force is provided to reorient the ferroelectric polarizations in the PMN-PT and some of the rotated in-plane ferroelectric polarization variants are further rotated out-of-plane along the depolarized <111> directions. This second non-180° polarization rotation decreases the remnant strain, inducing a smaller remnant strain compared to the peak value, as shown in both ±0.28 MV/m and ±0.3 MV/m curves. A higher reversing electric field promotes more in-plane ferroelectric polarizations to rotate out of the sample plane, therefore the remnant strain in ±0.3 MV/m curve (point 2) is smaller than that in the ±0.28 MV/m curve (point 1). The corresponding polarization state at point 1 consists of more in-plane polarization variants compared to point 2, as shown in FIG. 16. On the other hand, if the reversing electric field is smaller than $E_{cr}$, the driving force can only rotate a portion of the ferroelectric polarizations from out-of-plane to in-plane, also resulting in a smaller remnant strain (point 3 in ±0.1 MV/m curve). Although both approaches would theoretically achieve the same remnant strain value, the polarization states of the remnant strains and the piezoelectric strain response under positive poling electric fields are dramatically different. As shown in the polarization configuration figures at points 2 and 3, both states are the combination of out-of-plane and in-plane <111> polarization variants, however, the directions of the out-of-plane variants are different. For the remnant strain achieved by reversing electric field larger than $E_{cr}$, another strain jump would occur due to the non-180° degree polarization rotation when a positive electric field is applied. The preferred approach to tuning the remnant strain may depend on the application. For example, if it is desirable to utilize this tunable remnant strain followed by a complete poling to set a pre-strain/stress, applying a small reversing electric field would be better, since it avoids another strain jump during the repolarization process.

History Dependence

Figure 16A:
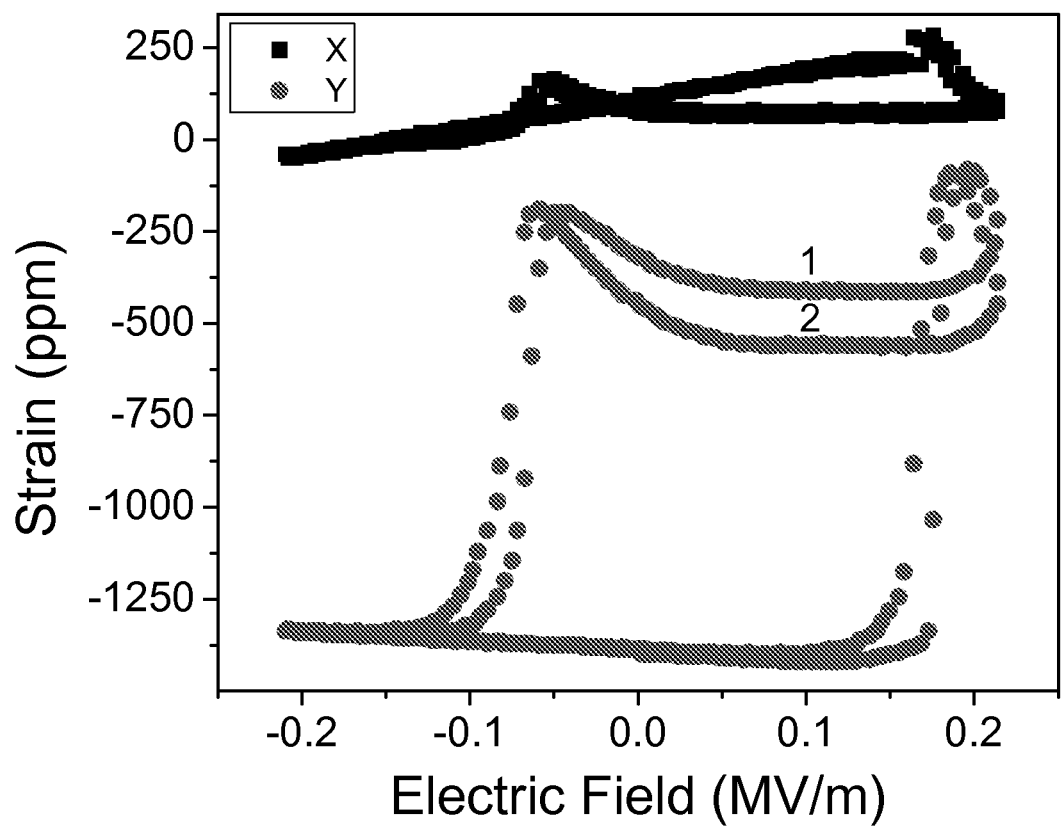
FIGS. 16A-16B show the first two cycles of piezoelectric strain curves with a reversing electric field of (16A) 0.22 MV/m and (16B) 0.24 MV/m. The specimen is fully polarized by a negative electric field.
Figure 16B:
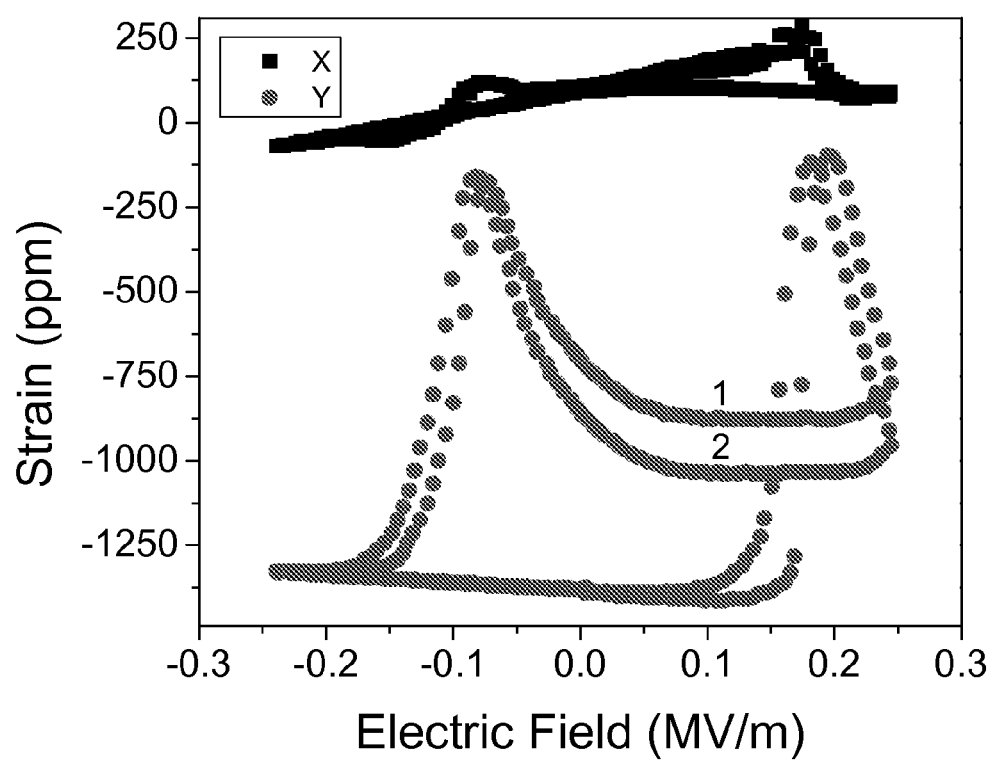

FIGS. 16A and 16B show the piezoelectric strain curves of the first two cycles after the material is fully polarized by a negative electric field. The reversing electric fields are larger than the critical electric field $E_{cr}$ in order to create a strain hysteresis loop with two stable remnant strain states. In each figure, the strain jump peak values are almost the same for the first two cycles; however, the remnant strain and the critical electric field $E_{cr}$ are slightly shifted. These curves become stable and consistent after a few cycles (i.e. cycle 3 falls on top of cycle 2 in FIG. 16) and are highly repeatable. This ferroelectric history dependent property can be explained from the initial resistance to alignment of the polarization variants from the initial poling process. That is, the large nonlinear strain response is dependent upon realignment of the four in-plane <111> polarization variants. In the first couple of cycles there may be an internal friction dictating the path of the polarization variant realignment process which results in slightly different strains. Once this realignment path is established such that the polarization variants follow the same path, the strain response stabilizes. Therefore, to achieve strain stability the PMN-PT ferroelectric material requires a training process.

Switching and Fatigue

The 1 Hz switching response and fatigue properties for a sample cycled 10 hours have been initially characterized.

Figure 17:
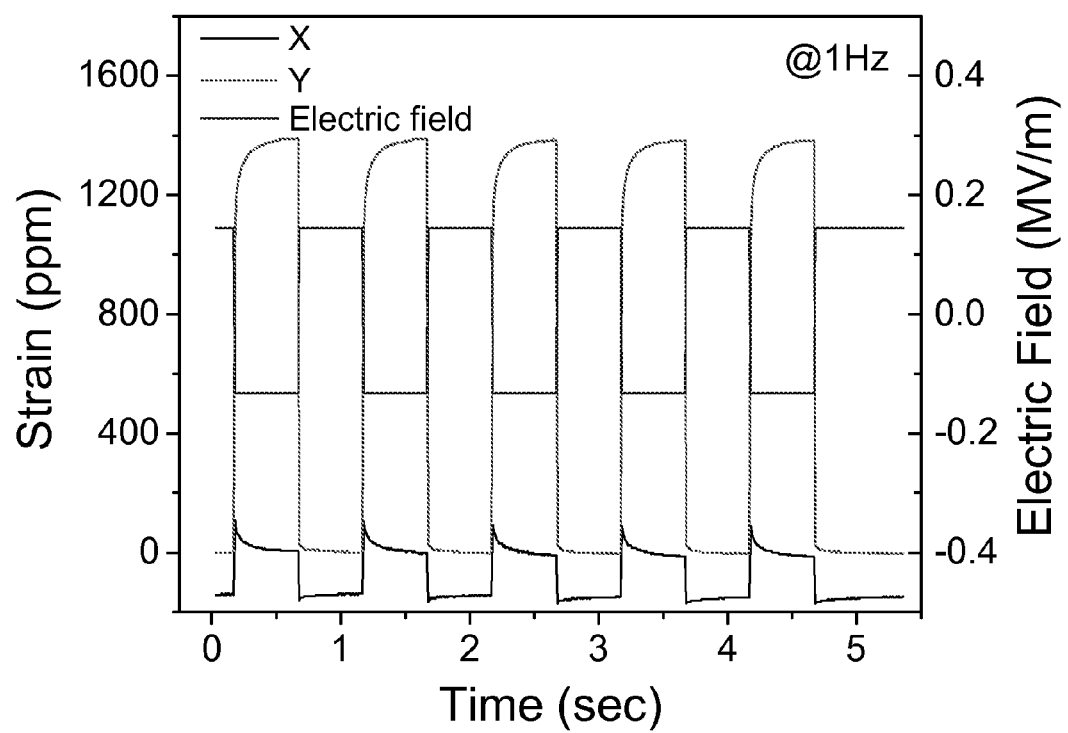
FIG. 17 shows piezoelectric strain switching characteristics of PMN-PT by cycling a bipolar square wave between two critical electric fields at 1 Hz according to an embodiment of the current invention.

FIG. 17 shows the piezoelectric strains along both the $\vec{x}$ and $\vec{y}$ directions obtained during bipolar square wave cycling between two critical electric fields at 1 Hz. The piezoelectric strain response at 1 Hz follows the excitation electric field actuation. When the PMN-PT specimen was cycled for over 10 hours, no significant decrease in strain response was observed. To evaluate the stability, the specimen was left in the giant remnant strain state (i.e. point E in FIG. 14A) with the electrical connections disconnected to avoid electric discharge. After 48 hours, the remnant strain value did not change, indicating the state is stable for the time period studied.

Asymmetric Properties

Figure 18:
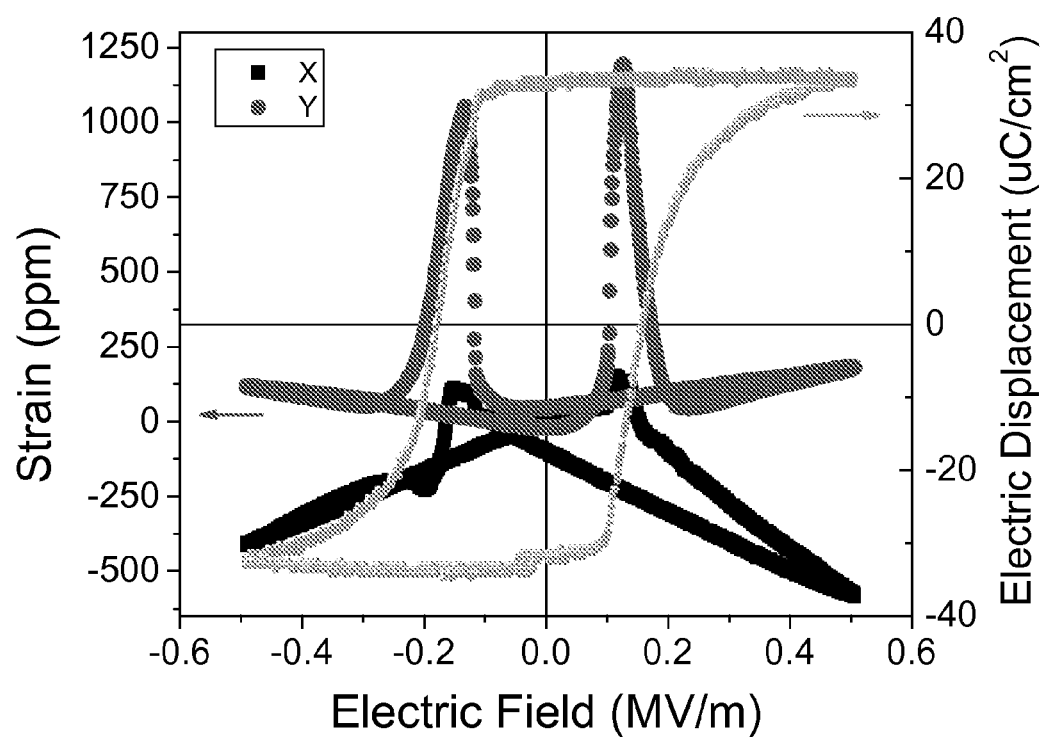
FIG. 18 shows both bipolar piezoelectric strain $\epsilon$-E and electric displacement D-E curves within ±0.5 MV/m. The piezoelectric strain data was recorded from a fully polarized state in the $z$ direction.

The single crystal ferroelectrics used in this study exhibit some asymmetric properties in the large field response curves. As shown in the full range bipolar strain curves in FIG. 13, the two strain peaks are unequal. Furthermore, when viewing the electric displacement curve (D-E) in FIG. 18 it becomes apparent that the coercive fields $E_c$ and the critical electric fields $E_{cr}$ for two peaks are not identical. The slight shift of $E_c$ and $E_{cr}$ might be due to several reasons. First, the piezoelectric strain measurement was performed with only a single strain gauge attached to one surface. The incomplete coverage of a surface electrode or the existence of a strain gauge on one side may induce some asymmetric anomalies in the measurement process. Contrasting this result with the measurements made on the relatively small specimens without a strain gauge shown in FIG. 8, one finds the small specimen without a strain gauge did not display a noticeable shift of coercive fields $E_c$. Another contributing factor in asymmetric response maybe due to the slight misalignments of the single crystal produced during cutting the sample or misalignment when attaching the strain gauge on the specimen. Another possible reason is the PMN-PT single crystals may contain multiple phase structures other than only one rhombohedral phase. Some evidence is that the $E_{cr}$ never overlaps with $E_c$, i.e. the strain jump peaks do not occur where the net polarization is zero along the poling direction (out-of-plane a $\vec{z}$ direction). FIG. 18 shows that the maximum strain jumps occur between the coercive field and the electric field at which the ferroelectric polarizations start to rotate or decrease. This phenomenon cannot be explained based on just non-180° polarization reorientation in a simple rhombohedral crystal structure. Other complex phase components as reported by other researchers in such PMN-PT (PT %=0.32) crystals may contribute to the unique ferroelectric properties and asymmetric behavior.

Conclusions

In this example the ferroelectric properties of (011) PMN-PT (PT %=0.32) single crystal materials and the ability to electrically switch between remnant strain states were described. Two giant reversible and stable remnant strain states and tunable remnant strain properties can be achieved by properly reversing the electric field from the polarized direction. The unique piezoelectric strain response, especially along the [100] direction, mainly stems from non-180° ferroelectric polarization reorientation in the rhombohedral phase crystal structure. Other ferroelectric properties, such as dielectric constant, piezoelectric switching response and fatigue, were also addressed. Such giant strain hysteresis with tunable remnant strain properties may be useful for magnetoelectric based memory devices and would be a potential candidate for other applications.

References For Example 1

1 M. Bibes and A. Barthelemy, Nat. Mater. 7 (6), 425 (2008).
2 N. A. Pertsev and H. Kohlstedt, Appl. Phys. Lett. 95 (16), 163503 (2009).
3 J.-M. Hu, Z. Li, J. Wang, J. Ma, Y. H. Lin, and C. W. Nan, J. Appl. Phys. 108 (4), 043909 (2010).
4 M. Fiebig, J. Phys. D, Appl. Phys. 38 (8), R123 (2005).
5 W. Eerenstein, N. D. Mathur, and J. F. Scott, Nature 442 (7104), 759 (2006).
6 S.-W. Cheong and M. Mostovoy, Nat. Mater. 6 (1), 13 (2007).
7 C.-W. Nan, M. I. Bichurin, S. X. Dong, D. Viehland, and G. Srinivasan, J. Appl. Phys. 103 (3), 031101 (2008).
8 T. Wu, C.-M. Chang, T.-K. Chung, and G. Carman, IEEE Trans. Magn. 45 (10), 4333 (2009).
9 J. Zhai, Z. Xing, S. X. Dong, J. F. Li, and D. Viehland, Appl. Phys. Lett. 88 (6), 062510 (2006).
10 Y. Tokura, Science 312 (5779), 1481 (2006).
11 Y.-H. Chu, L. W. Martin, M. B. Holcomb, M. Gajek, S.-J. Han, Q. He, N. Balke, C.-H. Yang, D. Lee, W. Hu, Q. Zhan, P.-L. Yang, A. Fraile-Rodriguez, A. Scholl, S. X. Wang, and R. Ramesh, Nat. Mater. 7 (6), 478 (2008).
12 P. Zhao, Z. Zhao, D. Hunter, R. Suchoski, C. Gao, S. Mathews, M. Wuttig, and I. Takeuchi, Appl. Phys. Lett. 94 (24), 243507 (2009).
13 T.-K. Chung, S. Keller, and G. P. Carman, Appl. Phys. Lett. 94 (13), 132501 (2009).
14 T.-K. Chung, K. Wong, S. Keller, K. L. Wang, and G. P. Carman, J. Appl. Phys. 106 (10), 103914 (2009).
15 T. Wu, T.-K. Chung, C.-M. Chang, S. Keller, and G. P. Carman, J. Appl. Phys. 106 (5), 054114 (2009).
16 J.-M. Hu and C. W. Nan, Phys. Rev. B 80 (22), 224416 (2009).
17 T. Wu, M. Emmons, T.-K. Chung, J. Sorge, and G. P. Carman, J. Appl. Phys. 107 (9), 09D912 (2010).
18 J.-M. Hu, Z. Li, J. Wang, and C. W. Nan, J. Appl. Phys. 107 (9), 093912 (2010).
19 K. Uchino, Ferroelectrics 151 (1), 321 (1994).
20 W. Heywang, K. Lubitz, W. Wersing, and L. E. Cross, in Piezoelectricity (Springer Berlin Heidelberg, 2008), Vol. 114, pp. 131.
21 Z.-G. Ye and M. Dong, J. Appl. Phys. 87 (5), 2312 (2000).
22 S.-E. Park and T. R. Shrout, J. Appl. Phys. 82 (4), 1804 (1997).
23 J.-M. Kiat, Y. Uesu, B. Dkhil, M. Matsuda, C. Malibert, and G. Calvarin, Physical Review B 65 (6), 064106 (2002).
24 E. V. Colla, N. K. Yushin, and D. Viehland, J. Appl. Phys. 83 (6), 3298 (1998).
25 Z. Li, Z. Xi, Z. Xu, and X. Yao, Journal of Materials Science Letters 21 (17), 1325 (2002).
26 X. Zhao, B. Fang, H. Cao, Y. Guo, and H. Luo, Materials Science and Engineering B 96 (3), 254 (2002).

27 X. Wan, R. K. Zheng, H. L. W. Chan, C. L. Choy, X. Zhao, and H. Luo, J. Appl. Phys. 96 (11), 6574 (2004).
28 F. Zuyong and et al., Journal of Physics: Condensed Matter 16 (21), 3769 (2004).
29 E. A. McLaughlin, T. Liu, and C. S. Lynch, Acta Materialia 53 (14), 4001 (2005).
30 Z. Kutnjak, J. Petzelt, and R. Blinc, Nature 441 (7096), 956 (2006).
31 J. Han and W. Cao, Physical Review B 68 (13), 134102 (2003).
32 W. Ren, S. F. Liu, and B. K. Mukherjee, Appl. Phys. Lett. 80 (17), 3174 (2002).
33 S.-F. Liu, S.-E. Park, T. R. Shrout, and L. E. Cross, J. Appl. Phys. 85 (5), 2810 (1999).
34 D. Viehland and J. F. Li, J. Appl. Phys. 92 (12), 7690 (2002).
35 G. Yiping, H. LUO, H. Tianhou, X. Haiqing, and Y. Zhiwen, Jpn. J. Appl. Phys 41, 1451 (2002).
36 T. Liu and C. S. Lynch, Journal of Intelligent Material Systems and Structures 17 (10), 931 (2006).
37 D. Lin, Z. Li, S. Zhang, Z. Xu, and X. Yao, J. Appl. Phys. 108 (3), 034112 (2010).
38 Y. Lu, D. Y. Jeong, Z. Y. Cheng, Q. M. Zhang, H.-S. Luo, Z.-W. Yin, and D. Viehland, Appl. Phys. Lett. 78 (20), 3109 (2001).
39 T. Liu and C. S. Lynch, Acta Materialia 51 (2), 407 (2003).
40 T. Liu and C. Lynch, Integrated Ferroelectrics 71 (1), 173 (2005).
41 H. Fu and R. Cohen, Nature 403 (6767), 281 (2000).
42 T. Wu, A. Bur, P. Zhao, K. P. Mohanchandra, K. Wong, K. L. Wang, C. S. Lynch, and G. P. Carman, Appl. Phys. Lett 98 (1), 012504 (2011).
43 B. Noheda, D. E. Cox, G. Shirane, J. Gao, and Z. G. Ye, Physical Review B 66 (5), 054104 (2002).
44 Z. G. Ye, Current Opinion in Solid State and Materials Science 6 (1), 35 (2002).
45 A. K. Singh and D. Pandey, Physical Review B 67 (6), 064102 (2003).

EXAMPLE 2

Magnetic random access memory (MRAM) is a potential candidate for the next generation of high density memory technologies[1]. The magnetic tunnel junction (MTJ)[2] provides a viable approach to read data, but the ability to electrically write non-volatile bit information still remains a major issue. Recently, researchers have suggested using magnetoelectric materials to electrically control magnetization reorientation (i.e. write data) via coupling between magnetic and ferroelectric order parameters.[3-12] _ENREF_3 Hu et al.[13] and Pertsev et al.[14] presented concepts for designing a magnetoelectric (ME) based ME-MRAM deposited onto a ferroelectric substrate. The writing consists of reorienting the magnetization direction by 90° using the strain induced by the ferroelectric layer coupled with the magnetocrystalline anisotropy of the ferromagnetic layer to switch between two stable magnetic states. The concept seems plausible and promising; however, no results have been reported.

Recently, Wu et al.[11] experimentally demonstrated an electric field induced reversible and permanent transition from a magnetic isotropic easy plane to a uniaxial magnetic anisotropy in Ni/(011)[Pb(Mg$_{1/3}$Nb$_{2/3}$)O$_3$]$_{(1-x)}$-[PbTiO$_3$]$_x$(PMN-PT, x≈0.32) ME heterostructure. However, the magnetization states (i.e. one easy plane and one easy axis) did not provide two uniaxial easy axes 90° apart, which is desired for writing/storing bit information. In this example, we extend the approach demonstrated by Wu et al.[11] to reorient the magnetic easy axis between two perpendicular uniaxial easy axes. This is achieved by engineering a remnant strain in the PMN-PT substrate prior to Ni deposition so that an initial magnetoelastic anisotropy is created in the Ni film after the PMN-PT substrate is fully poled.

In this example, we describe a magnetoelectric Ni/PMN-PT heterostructure providing two electrically reversible and permanent magnetic easy axes. An initial magnetoelastic anisotropy in Ni film (i.e. a preferred easy axis) is achieved by first partially poling the (011) PMN-PT substrate to generate a specific remnant strain prior to Ni film deposition. Reorientation of the magnetic easy axis is achieved by taking advantage of the large anisotropic strain hysteresis properties. Within the context of a ME-MRAM device, a micromagnetic simulation is subsequently used to design a nanoscale magnetic single domain showing that the two remnant strains produced by PMN-PT substrate are sufficient to achieve electric-field-induced 90° magnetization reorientation.

Figure 19:
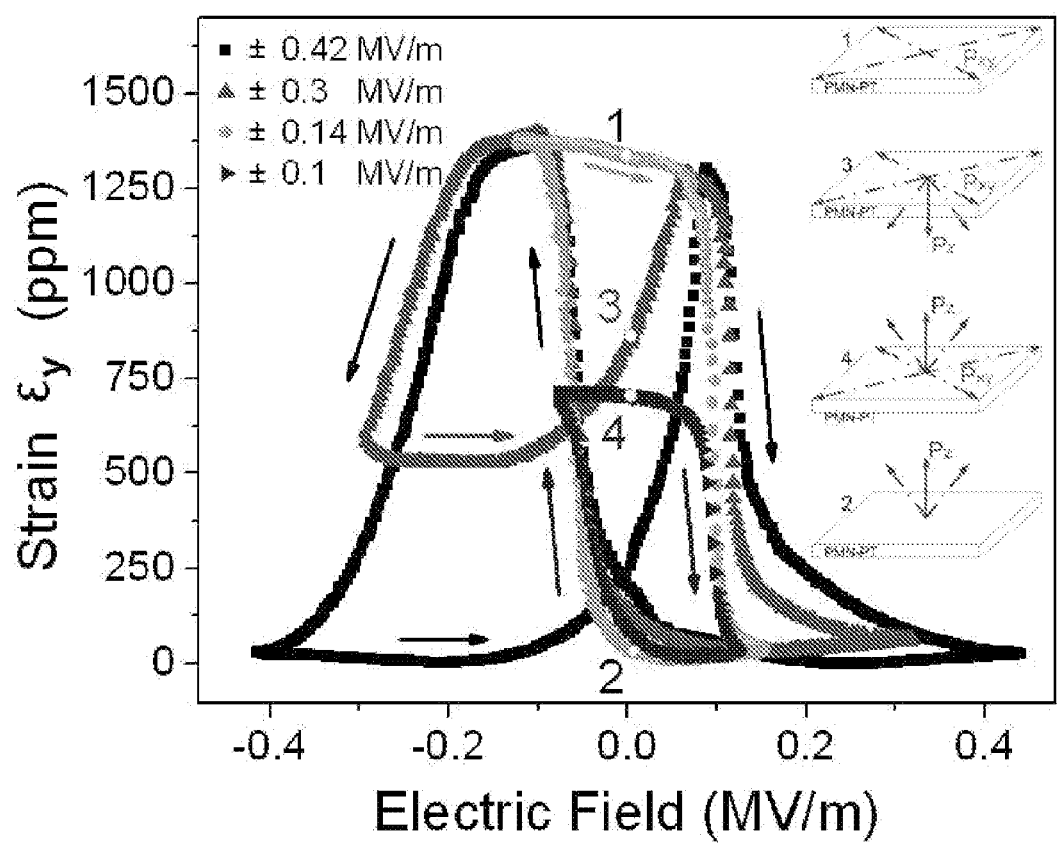
FIG. 19 shows piezoelectric strain response of (011) PMN-PT along $\vec{y}$ direction under different bipolar sweeping electric fields. The drawing shows the sample configuration and coordinates. The arrows indicate the directions of the bipolar electric fields.

Prior to the Ni film deposition, the 0.5 mm thick PMN-PT substrate was electro-mechanically characterized to determine the electric field to produce a specific remnant strain, i.e. half way between the maximum strains produced by the PMN-PT. FIG. 19 provides experimental strains of PMN-PT as a function of different bipolar electric fields ($\epsilon$-E). In these plots only the strain along the y direction is presented since the x strain response is substantially smaller.[11] All the data presented are recorded from a fully polarized state in the $\vec{z}$ direction and following stabilization of the ($\epsilon$-E) curves. Similar to the previous report by Wu et al.[11], two giant strain jump peaks are present in the ±0.42 MV/m curve as well as a giant strain hysteresis is present in the ±0.14 MV/m curve. For the ±0.14 MV/m curve, two stable remnant strain states exist (points 1 and 2) defining a critical electric field $E_{cr}$ (−0.14 MV/m) at which the remnant strain is maximized. The giant remnant strains arise from non-180° degree polarization rotations of <111> variants from out-of-plane (i.e. close to z direction) to x-y in-plane direction.[11] The polarization state at point 1 consists of a <111> polarization variant mainly aligned in the x-y plane (illustration 1), while the polarization state at point 2 consists of <111> variants closest to the $\vec{z}$ direction (illustration 2). If the electric field is cycled at values larger than $E_{cr}$ (e.g. ±0.3 MV/m curve) and subsequently removed such that the remnant strain is present as defined by point 3 in FIG. 1, the polarization state consists of a combination of <111> variants aligned in-plane and <111> variants diametrically opposed to the original poling direction. As can be seen in this figure the remnant strain at point 3 is approximately half way between points 1 and 2. On the other hand, if the electric field is cycled at values smaller than $E_{cr}$ (e.g. ±0.10 MV/m curve) and subsequently removed such that the remnant strain is at point 4, the polarization state consists of a combination of <111> variants aligned in-plane and <111> variants close to the original poling direction. The remnant strain at point 4 is similar to point 3 and is also approximately half way between the maximum remnant strains of points 1 and 2 defined by the ±0.14 MV/m curve.

These two electric cycling approaches (i.e. ±0.3 MV/m and ±0.1 MV/m curves) produce a partially poled ferroelectric substrate with a remnant strain half way between the maximum and minimum values (points 1 and 2). However, while the strain is relatively equivalent for these two electric cycling approaches the crystallographic orientations of the variants are different. As shown in the illustrations 3 and 4, the directions of the variants aligned with the z axis for points 3 and 4 are diametrically opposite. To avoid additional repolarization, we only consider the ±0.1 MV/m partial poling to induce a specific remnant strain prior to Ni deposition in this manuscript.

Figure 20:
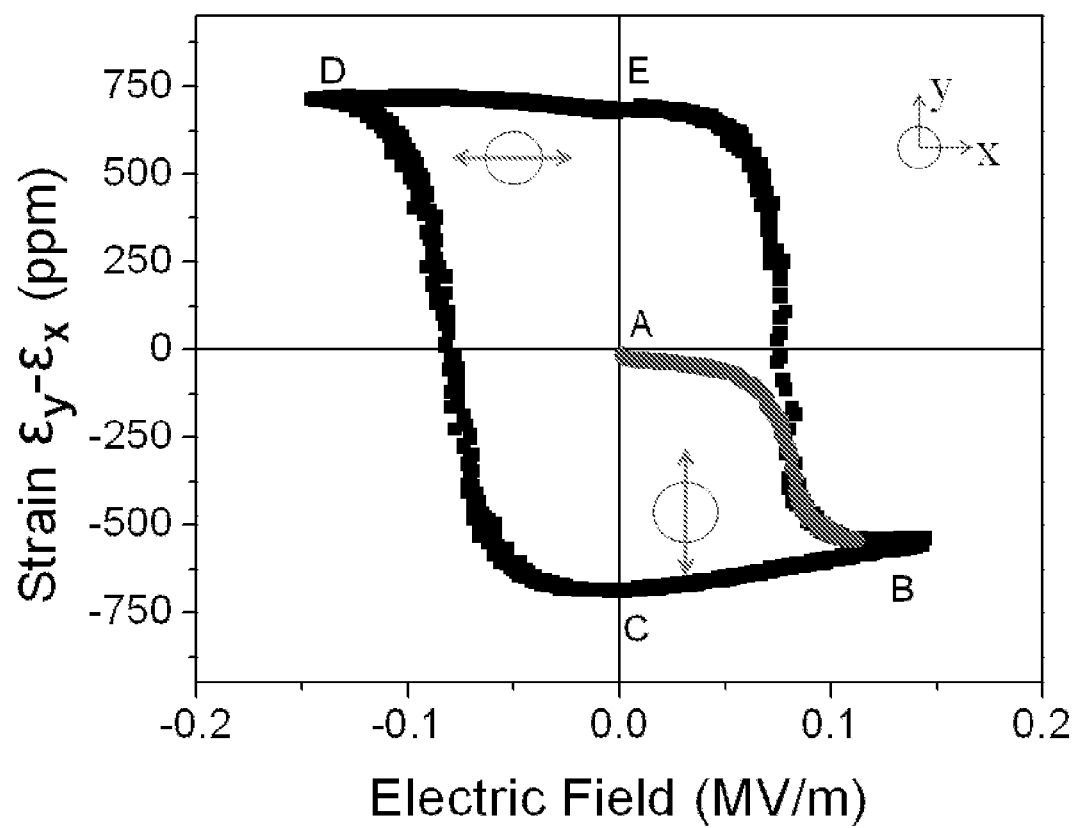
FIG. 20 shows piezoelectric strain difference $\epsilon_y-\epsilon_x$ as a function of applied electric field within $\pm E_{cr}$. The initial point A is defined as the strain free state of as deposited Ni film. The loop B-C-D-E-B shows a complete strain hysteresis. The drawings indicate the magnetization state: (B) and (C) easy axis along $\vec{y}$, (D) and (E) easy axis along $\vec{x}$.

Once the remnant strain state (point 4 in FIG. 19) is produced, a 5 nm Ti adhesive layer was deposited followed by a 35 nm Ni thin film onto the PMN-PT sample. FIG. 20 shows the measured anisotropic strain $\epsilon_y$-$\epsilon_x$ generated in the Ni film as a function of applied electric field. Note that point A in FIG. 20 corresponds to point 4 in FIG. 19. The initial point A is defined as the zero strain of the as deposited Ni film. When a positive electric field of 0.14 MV/m is applied and released (points B to C), approximately −700 ppm anisotropic compressive strain (point C) is produced in the Ni film. By applying and releasing a −0.14 MV/m electric field (points D to E), the PMN-PT substrate undergoes a giant strain jump[11] and produces approximately +700 ppm anisotropic tensile strain (point E) in the Ni film. As can be seen in the FIG. 20, cycling the electric field between ±0.14 MV/m switches the remnant anisotropic strain state of Ni/PMN-PT back and forth between to −700 ppm compressive to +700 ppm tensile. Therefore, the strain induced in the Ni film can be reversibly and permanently switched between two stable remnant strain states (points C and E) of equal and opposite magnitudes.

Figure 21A:
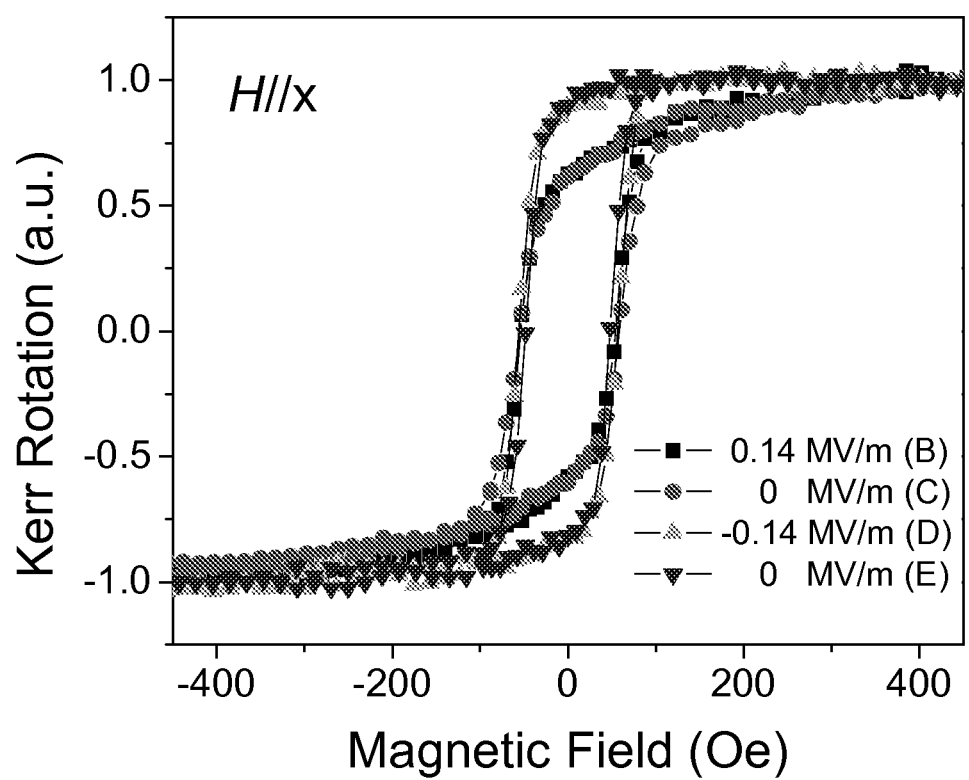
FIGS. 21A and 21B show normalized Kerr rotation hysteresis curves (M-H) along (21A) $\vec{x}$ direction; and (21B) $\vec{y}$ direction under different electric fields (Letters are the representative of the labeled strain states of the hysteresis loop in the FIG. 20.
Figure 21B:
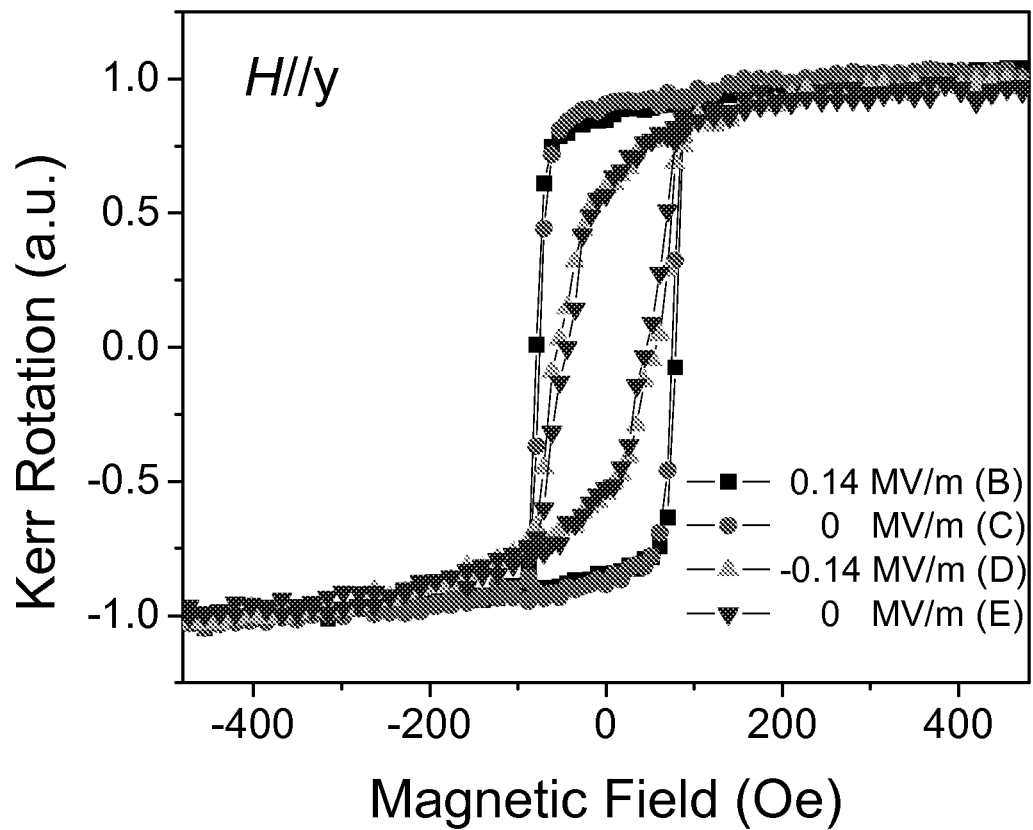

FIGS. 21A and 21B show the normalized Kerr hysteresis curves (M-H) of the Ni film on the PMN-PT substrate. Magnetic measurements are performed along both $\vec{x}$ and y directions for four constant electric fields. All of the constant electric fields are within the strain hysteresis loop B-C-D-E-B as shown in FIG. 20. Note that while there are two curves represented by 0 MV/m in FIG. 21, they represent two distinctly different remnant strain states as identified in FIG. 20 (points C or E). The compressive strains (points B and C) applied on the Ni film induce an initial magnetoelastic anisotropy aligned along the $\vec{y}$ direction as seen in FIGS. 21A and 21B. The normalized remnant magnetization $M_r/M_s$ in curves B and C are greater than 0.9 along $\vec{y}$ while below 0.7 along $\vec{x}$. By applying a −0.14 MV/m electric field to the sample and releasing it, the strain state of Ni film switches from compressive to tensile along the $\vec{y}$ direction, which reorients the magnetic anisotropy from $\vec{y}$ to $\vec{x}$ as seen in curves D and E of FIGS. 21A and 21B. Since the two remnant strain states at points C and E are reversible and stable, the magnetic easy axis of Ni film can be reversibly and permanently switched between two stable magnetic easy axes perpendicular to each other.

Although our experimental data indicates that the magnetization of a thin film ME heterostructure can be electrically switched between two stable perpendicular magnetic easy axes, numerous specifications related to the development of a ME-MRAM are required, including (i) a single domain magnetization state to store the bit information, and (ii) a magnetic energy barrier for each magnetization state for thermal stability. Here we use a commercial LLG Micromagnetic Simulator[15] to demonstrate a possible circular nanodisc design that satisfies both mentioned requirements assuming the remnant strains in FIG. 2.

Figure 22A:
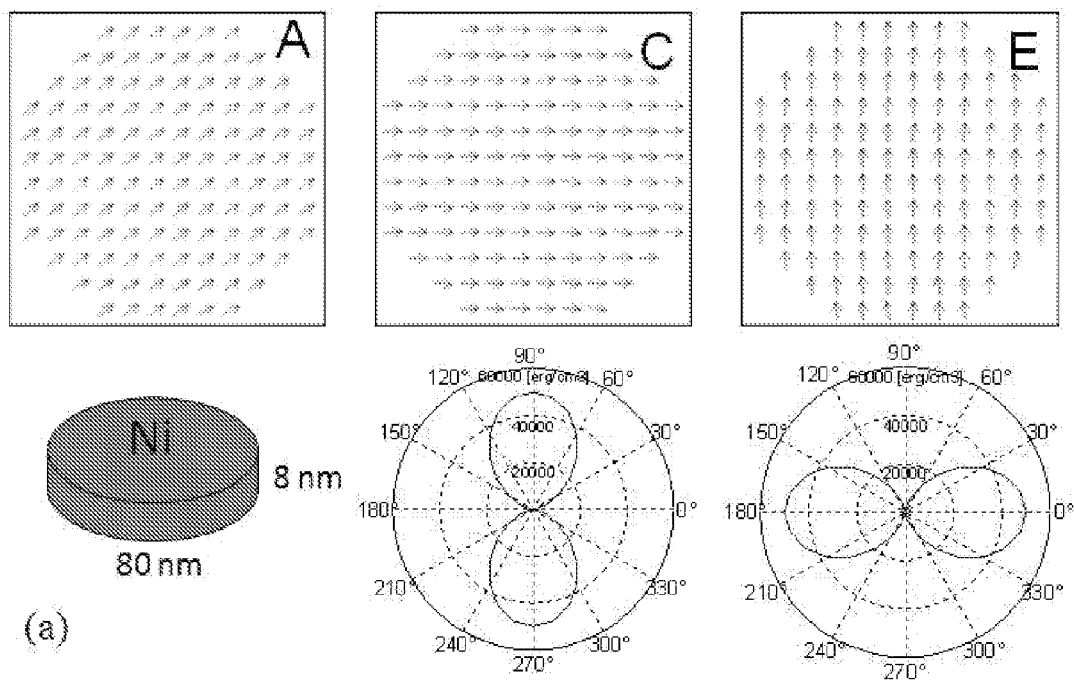
FIG. 22A shows magnetic single domain configurations of an 80 nm diameter 8 nm thick Ni nanodisk under applied strains of +700 ppm (E), 0 ppm (A) and −700 ppm (C) computed from micromagnetic simulation.

The equilibrium magnetization results from the minimization of the free energy by incorporating the strain-induced magnetic anisotropy into the magnetoelastic term.[16] FIG. 22A shows the simulated magnetic domain states for an 80 nm diameter and 8 nm thick (80 nm×8 nm) Ni nanodisk structure under three different remnant strain states shown in FIG. 2, i.e. 1) 0 ppm (point A), 2) +700 ppm (point E), and 3) −700 ppm (point C). FIG. 22A illustration A shows that the Ni nanodisk is a single domain in the absence of strain. The illustrations C and E indicate that the application of ±700 ppm strains causes the nanodisk to reorient its magnetization by 90°. Therefore, by electrically cycling the strain between points C and E, a single domain state can be permanently reoriented by 90°. The corresponding energy density as function of magnetization direction for points C and E are also plotted. Two minimum energy states located at 0°/180° for point C and 90°/270° for point E, respectively. The energy barrier between points C and E is calculated to be $K_{eff}$=5×10$^5$ erg/cm$^3$. The energy barrier ratio for this particular volume at room temperature is $K_{eff}V/K_bT$≈50 which is sufficient to satisfy the thermal stability criteria suggested for ME-RAM applications.[17]

Figure 22B:
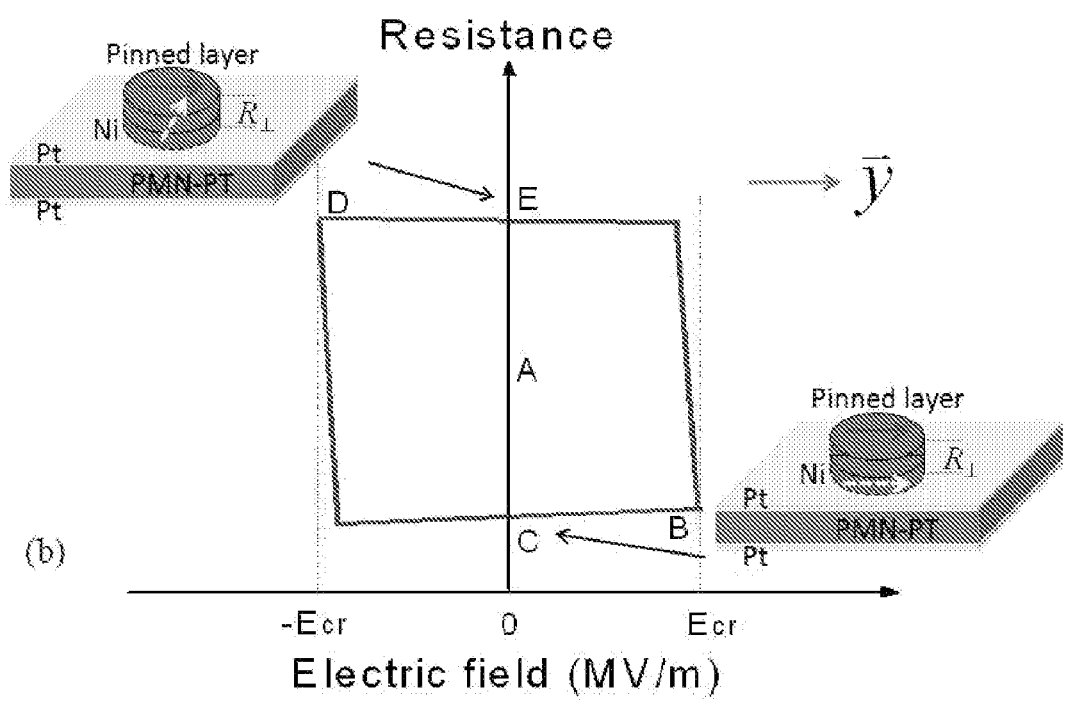
FIG. 22B shows a hysteresis loop of the tunneling magnetoresistance (TMR) as a function of applied electric field accompanied with the magnetization switching.

FIG. 22B illustrates the change in tunneling magnetoresistance (TMR) as a function applied electric field within ±$E_{cr}$ for a ME-MRAM device with a patterned MTJ unit on top of the (011) PMN-PT/Ni element. Since the magnetization of the Ni nanodisk is a function of the remnant strain state (points C or E), the TMR shows a minimum value R$_□$ when the pinned layer and Ni nanodisk have the same magnetization direction (point C) and a maximum R$_⊥$ when the magnetization vector in the Ni nanodisk rotates perpendicular to the pinned layer. By applying and releasing the electric field at ±$E_{cr}$ two perpendicular magnetic single domain states are switched and retained. Therefore, the non-volatile bit information "0" or "1" can be written by a low electrical energy and read by measuring the TMR.

In summary, we have demonstrated a Ni/PMN-PT ME heterostructure providing an electric-field-induced switching between two reversible and permanent magnetic easy axes perpendicular to each other. The tunable remnant strain defines the initial magnetoelastic anisotropy while the giant strain hysteresis reversibly and permanently reorients the magnetization state. The experimental data were used to design a ME-RAM with MTJ unit for information storage. This magnetoelectric memory approach can provide technology for spintronics and MRAM applications.

References For Example 2

1 J. G. Zhu, P Ieee 96, 1786 (2008).
2 M. Bibes and A. Barthelemy, Nat Mater 7, 425 (2008).
3 C.-W. Nan, M. I. Bichurin, S. X. Dong, D. Viehland, and G. Srinivasan, J. Appl. Phys. 103, 031101 (2008).
4 J. F. Scott, Nat. Mater. 6, 256 (2007).
5 F. Zavaliche, T. Zhao, H. Zheng, F. Straub, M. P. Cruz, P. L. Yang, D. Hao, and R. Ramesh, NANO LETTERS 7, 1586 (2007).
6 Y.-H. Chu, L. W. Martin, M. B. Holcomb, M. Gajek, S.-J. Han, Q. He, N. Balke, C.-H. Yang, D. Lee, W. Hu, Q. Zhan, P.-L. Yang, A. Fraile-Rodriguez, A. Scholl, S. X. Wang, and R. Ramesh, Nat Mater 7, 478 (2008).
7 M. Liu, O. Obi, J. Lou, Y. Chen, Z. Cai, S. Stoute, M. Espanol, M. Lew, X. Situ, K. S. Ziemer, V. G. Harris, and N. X. Sun, Adv. Funct. Mater. 19, 1826 (2009).
8 M. Liu, O. Obi, Z. Cai, J. Lou, G. Yang, K. S. Ziemer, and N. X. Sun, J. Appl. Phys. 107, 073916 (2010).
9 Z. Li, J. Wang, Y. Lin, and C. W. Nan, Appl. Phys. Lett. 96, 162505 (2010).
10 T. Wu, A. Bur, J. L. Hockel, K. Wong, T.-K. Chung, and G. P. Carman, IEEE Magn. Lett. 2, 6000104 (2011).
11 T. Wu, A. Bur, P. Zhao, K. P. Mohanchandra, K. Wong, K. L. Wang, C. S. Lynch, and G. P. Carman, Appl. Phys. Lett 98, 012504 (2011).
12 T. Wu, A. Bur, K. Wong, J. L. Hockel, C.-R. Hsu, H. K. D. Kim, K. L. Wang, and G. P. Carman, J. Appl. Phys. 109 (2011).
13 J.-M. Hu and C. W. Nan, Phys. Rev. B 80, 224416 (2009).

14 N. A. Pertsev and H. Kohlstedt, Appl. Phys. Lett. 95, 163503 (2009).

15 M. Scheinfein and E. Price, in http://llgmicro.home.mindspring.com/.

16 A. Bur, T. Wu, H. Kim, C.-J. Hsu, T.-K. Chung, K. Wong, K. L. Wang, and G. P. Carman, in submitted (2010).

17 B. Cullity and C. Graham, Introduction to magnetic materials. (Wiley-IEEE Press, Hoboken, N.J., 2008).

EXAMPLE 3

Ferroelectric materials have been used as electrically tunable capacitors due to their relatively large dielectric constant tunability.[1-3] However, conventional ferroelectrics require maintaining power (i.e. electric field) on the device to retain the dielectric constant value (i.e. polarization state), otherwise the dielectric constant returns to its initial state upon removal of the electric field. Recently, Wu et al.[4-6] discovered that meta-stable remnant strain and polarization states exist in (011) oriented $[Pb(Mg_{1/3}Nb_{2/3})O3]_{(1-x)}$-$[PbTiO3]_x$ (PMN-PT, x≈0.32) ferroelectric single crystal. This phenomenon was attributed to non-180° polarization rotation. In this example, we describe electrical tuning of the metastable dielectric constant in (011) PMN-PT ferroelectric single crystal. By implementing such a tunable and metastable ferroelectric capacitor into an RC oscillator, we demonstrate a reconfigurable RC oscillator as well as a ferroelectric memory device, enabling low power electronics that do not require constant power.

The (011) PMN-PT single crystal ferroelectrics were manufactured by Atom Optics CO., LTD. (Shanghai, China) using the modified Bridgeman growth method. In this example, the prepared specimens were polished to a thickness of approximately 0.25 mm. A 10 nm Ti and a 100 nm Pt layers were evaporated on both sides as the adhesion layer and surface electrodes, respectively. The surface roughness and local piezoresponse signal were characterized by Atomic Force Microscopy (AFM) and Piezoresponse Force Microscopy (PFM). A Transmission Electron Microscopy (TEM) was used to measure the electron diffraction patterns. The dielectric constants were calculated from measured capacitance value of the specimens using an HP4274A LCR meter under different external dc electric voltage bias conditions. The ac exciting level for the capacitance measurement is set to 0.1 V at 1 kHz.

Figure 23A:
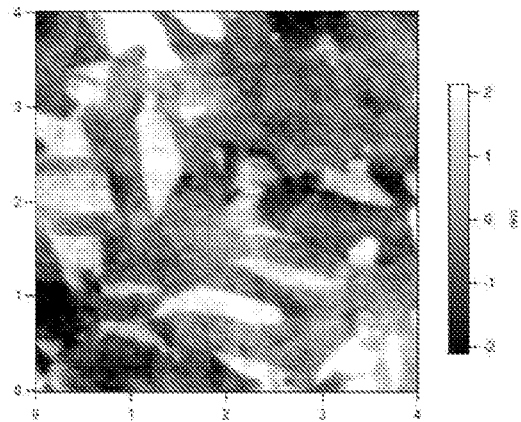
FIGS. 23A-23D show (a) AFM height image, (b) PFM phase image, (c) TEM SAD pattern, (d) HRTEM image of PMN-PT (the inset figure shows the FFT pattern).
Figure 23B:
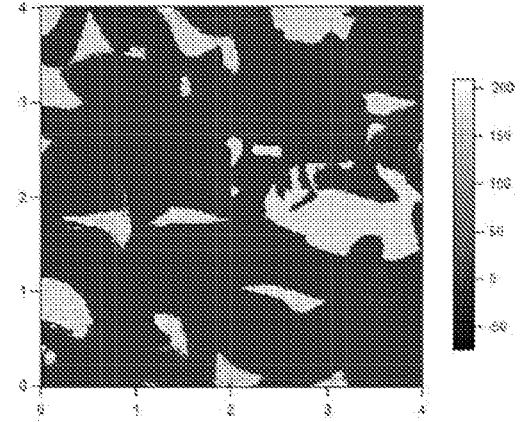
Figure 23C:
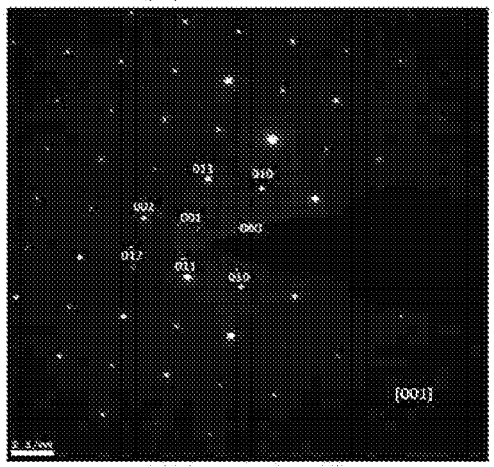
Figure 23D:
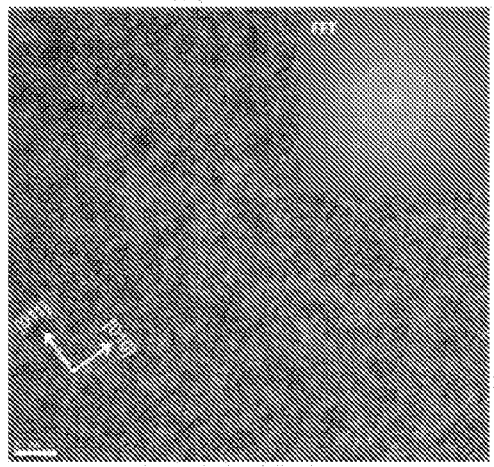

FIG. 23A shows the AFM topographic height data obtained from the (011) PMN-PT, indicating a standard deviation roughness of 1 nm. FIG. 23B shows the piezoresponse phase image with the presence of a random domain configuration prior to polarization. FIGS. 23C and 23D show the diffraction pattern and high resolution TEM micrograph (HRTEM), respectively. The sample was oriented with the surface perpendicular to the [001] zone axis and the principle crystal structure is pseudo-cubic.[7,8] HRTEM image shows the crystal lattice orientation along [011] direction and the inset of FIG. 23D shows the FFT pattern.

Figures 24A, 24B, 24C:
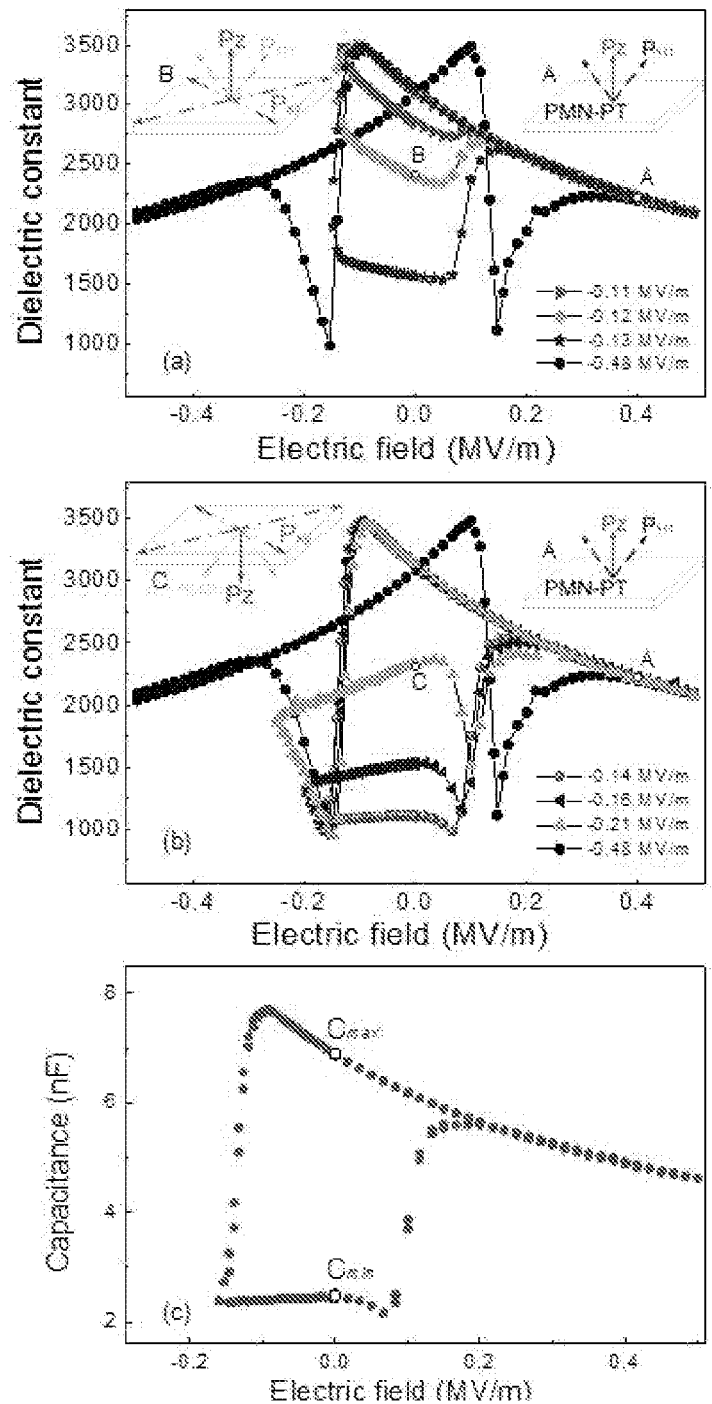
FIGS. 24A-24C show (a) Dielectric constant spectrum under different reversing electric fields smaller than $E_{cr}$, (b) dielectric constant spectrum under different reversing electric fields larger than $E_{cr}$, (c) switchable capacitance by sweeping electric field between −0.14 MV/m and 0.5 MV/m

FIGS. 24A and 24B show the dielectric constant of (011) PMN-PT ferroelectrics as a function of different external dc electric fields. For each curve, the bias electric field is defined with respect to the original poling direction and is stepped from +0.48 MV/m to seven different negative electric fields $E_n$. A full range bipolar curve, i.e. $E_n$=−0.48 MV/m, is shown in both figures. As the electric field is stepped from +0.48 MV/m to −0.10 MV/m, the dielectric constant shows a linear increase from approximately 2000 to 3500 and the polarization variants are mainly aligned along two out-of-plane [111] directions (see polarization configuration at point A). Moreover, a sharp decrease is observed in the dielectric constant from 3500 to 1000 at a bias electric field of approximately ±0.14 MV/m. The corresponding electric field ±0.14 MV/m is referred as the critical electric field $E_{cr}$. Since such single crystal ferroelectric relaxor has very complicated domain configurations and interactions in the morphotropic phase boundary (MPB) region, we attribute this giant dielectric constant drop to the non-180° polarization rotations in the rhombohedral crystal structure of (011) PMN-PT as previously described for remanent strain changes.[5] Several researchers have reported different anisotropy of the permittivity in single crystal PMN-PT substrate[9,10], the exact polarization configuration at $E_{cr}$ require further investigation. The curve of $E_n$=−0.48 MV/m is symmetric and one important feature about this particular curve is that at zero electric field the dielectric constant is the same regardless of what direction the zero electric field bias is approached.

The description of dielectric response for curves with $E_n$ near $E_{cr}$ is different than provided above. Specifically, as the electric field bias approaches zero from $E_n$, the dielectric constant is distinctly different when compared to the same curve but approaching zero electric field bias from 0.48 MV/m. For these cases, the reorientation of the polarization variants produces a reduced dielectric constant at zero electric field. For the curves with $E_n$ smaller than $E_{cr}$ shown in FIG. 24A, the polarization variants partially rotates from out-of-plane to in-plane, resulting a smaller dielectric constant at zero electric field. For curves with $E_n$ of −0.21 or −0.16 MV/m in FIG. 24B, the dielectric constant at zero electric field is also smaller than the fully poled state. One can note that a similar metastable dielectric constant value at zero electric field bias can be achieved by applying $E_n$ either larger or smaller than $E_{cr}$. The difference between these two cases is if $E_n$ is larger than $E_{cr}$ the polarization variants are aligned in plane and 180° opposite to the original poling direction (see polarization configuration at point C), but where if $E_n$ is smaller than $E_{cr}$ the polarization variants are aligned in-plane and parallel to the original poling direction (see polarization configuration at point B). The important point here is that metastable dielectric constants can be dialed in at values ranging from 1000 to 3000 by simply applying a negative electric pulse with a specific magnitude (i.e. $E_n$) to the positively poled crystal.

FIG. 24C shows a capacitance hysteresis loop generated by stepping the electric field between +0.48 MV/m and −0.14 MV/m that is used to evaluate a device. As presented in the curve with $E_n$ of −0.14 MV/m in FIG. 24B, the fully polarized state shows the maximum metastable capacitance ($C_{max}$) while the minimal capacitance ($C_{min}$) is present when an electric pulse of approximate −0.14 MV/m is applied (note both are at zero electric field bias). This result demonstrates that the ferroelectric substrate can used as a reconfigurable capacitor with two switchable capacitance states that differ by 300%. Utilizing proper capacitive sensing approach, such single crystal materials can be employed as a capacitive memory device or as a reconfigurable low power capacitor for many electronic applications.

In a previous study, Wu et al.[4] demonstrated magnetoelectric memory using the remnant strain property produced by (011) PMN-PT combined with a single domain ferromagnetic material. In this example we describe using such tunable dielectric constant or capacitance (see FIGS. 24A-24D) for a ferroelectric random access memory element (FeRAM).[11] This suggestion is different from present ferroelectric memory elements that utilize two opposite polarized states to store binary bit information. As shown in FIG. 24B, the metastable tunability of the dielectric constant occurs over a wide range of capacitive values and thus can potentially store multiple bit information as compared to binary. Furthermore, the tunable metastable dielectric constant can also be employed for use in devices such as RC oscillators, wave demodulators and capacitive tuning devices.

Figures 25A, 25B:
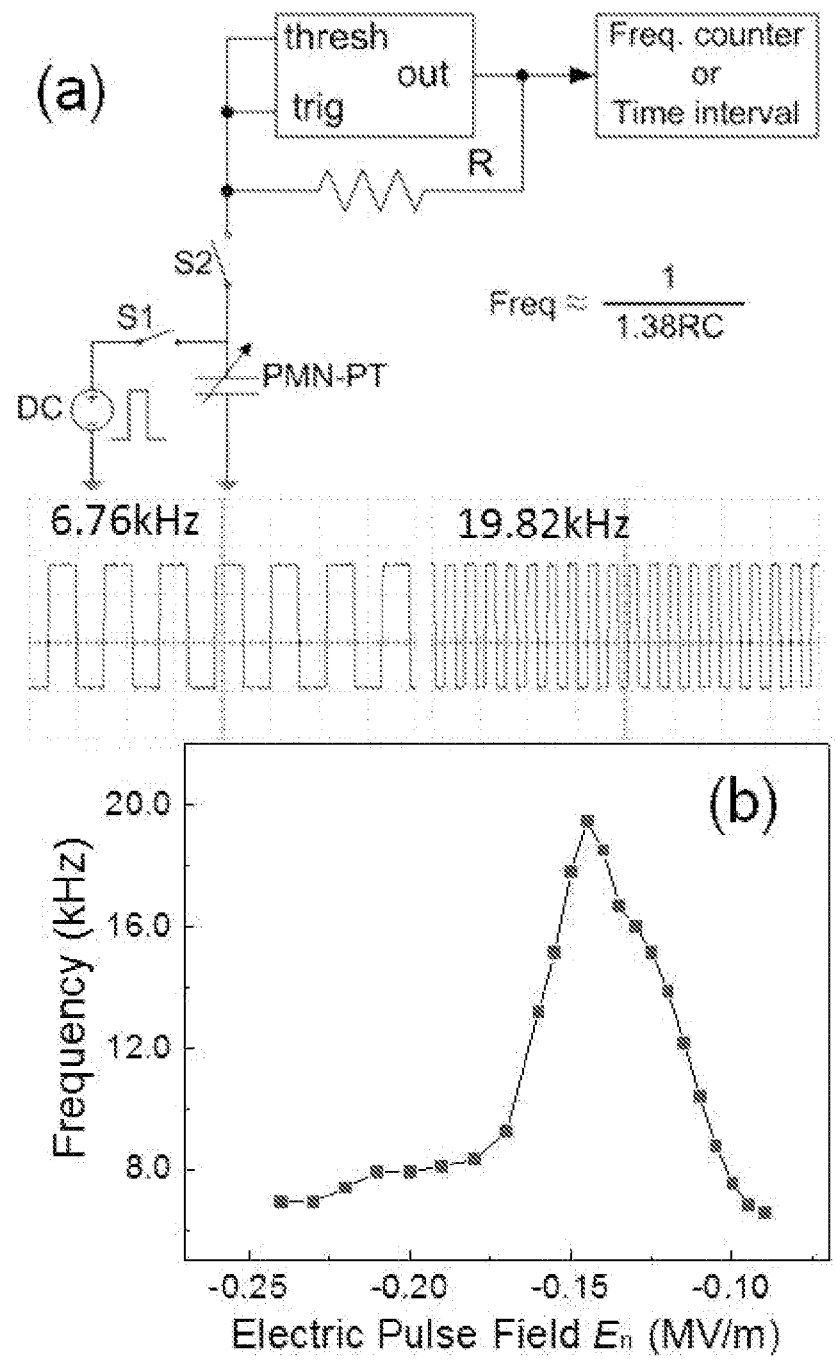
FIGS. 25A-25B show (a) RC oscillator circuit and two frequency outputs, and (b) output frequency as a function of the amplitude of applied reversing electric pulse according to an embodiment of the current invention.

FIG. 25A shows a sketch and experimental demonstration of a reconfigurable RC oscillator using PMN-PT as the quasi-static capacitor with a 12 kΩ standard resistor and a 555 timer chip. When the switch S1 is on, an electric pulse is applied to the PMN-PT sample to tune the metastable capacitance. After switch S1 is turned off and S2 is turned on, the PMN-PT ferroelectric capacitor is connected with the resistor into a Schmitt trigger circuit, which converts the capacitance change into a change of frequency or pulse width. The output frequency is monitored in this test using an oscilloscope. As shown in the results of FIG. 25A, the minimum and maximum oscillating frequency are measured with values of 6.76 kHz and 19.82 kHz. These values correspond to the maximum and minimum capacitance values of 2.86 nF and 7.98 nF as shown in FIG. 24B. By properly choosing the threshold level with RC frequency as the readout signal, the switching between minimum and maximum frequency output can be used as bit storage information, demonstrating a non-volatile ferroelectric memory device. By further tuning and calibrating the metastable dielectric constant, a reconfigurable RC oscillator with a high tunability and sensitivity can also be demonstrated.

FIG. 25B plots the output frequency as a function of the amplitude of applied reversing electric pulse. As indicated from FIG. 24A, the dielectric constant transition is very sharp; therefore, one can expect a high sensitive modulation of the RC oscillator by applying a negative electric pulse near $E_{cr}$. FIG. 25B indicates that the maximum sensitivity occurs near $E_{cr}$ and the frequency modulation is nearly linear. The entire circuit only requires an electric pulse to modulate the metastable dielectric constant of the PMN-PT ferroelectric capacitor, which consumes almost zero power compared to conventional voltage controlled ferroelectric capacitor devices.

In summary, we have described a tunable metastable dielectric constant in (011) PMN-PT single crystal ferroelectric material. The dielectric constant is switchable and remains switched after releasing the electric field due to metastable polarization states. A ferroelectric memory device and reconfigurable RC oscillator have been demonstrated using such tunable ferroelectric capacitor. Although an RC circuit was described in this example, capacitors according to embodiments of the current invention can also be used in LC and/or LRC circuits, for example.

References For Example 3
1. A. Tagantsev, V. Sherman, K. Astafiev, J. Venkatesh and N. Setter, Journal of Electroceramics 11, 5-66 (2003).
2. F. Kub, K. Hobart, J. Pond and S. Kirchoefer, Electronics Letters 35, 477-478 (1999)
3. M. Lancaster, J. Powell and A. Porch, Superconductor Science and Technology 11, 1323 (1998).
4. T. Wu, A. Bur, P. Zhao, K. P. Mohanchandra, K. Wong, K. L. Wang, C. S. Lynch and G. P. Carman, Appl. Phys. Lett. 98, 012504 (2011).
5. T. Wu, P. Zhao, M. Bao, A. Bur, J. L. Hockel, K. Wong, K. P. Mohanchandra, C. S. Lynch and G. P. Carman, J. Appl. Phys. 109, 124101 (2011).
6. T. Wu, A. Bur, K. Wong, P. Zhao, C. S. Lynch, P. K. Amiri, K. L. Wang and G. P. Carman, Appl. Phys. Lett. 98, 262504 (2011).
7. A. Hilton, C. Randall, D. Barber and T. Shrout, Ferroelectrics 93, 379-386 (1989).
8. P. Pavan, R. Bez, P. Olivo and E. Zanoni, Proceedings of the IEEE 85, 1248-1271 (1997).
9. F. Wang, Appl. Phys. Lett. 90, 212903 (2007).
10. R. Zhang, Appl. Phys. Lett. 82, 787 (2003).
11. Y. Arimoto and H. Ishiwara, MRS bulletin 29, 823-828 (2004).

EXAMPLE 4

Patterned ferromagnetic nanostructures have been studied extensively for applications in non-volatile data storage and memory, where information is to be encoded within the bit's magnetization direction. While attractive features include stability and predictability of magnetic states, these characteristics simultaneously inhibit magnetic manipulation for recording. For example, in bi-stable single domain nanostructures the large shape anisotropy requires relatively large external energy to switch the magnetization (i.e., high strength magnetic field).[1] Therefore, geometries and writing mechanisms need to be investigated that can easily switch magnetization directions with low power.

Several approaches to lower the energy barrier between magnetic states have been attempted using low geometric ratios and/or magnetic meta-stabilities and switching mechanism which include current injection,[2] voltage-induced magnetic anisotropy,[3] and magnetoelastic strain.[4] More recently, the ring geometry has been studied for both its unique metastable "onion" magnetization state, and its stable "vortex" state, for encoding a bit of information in chirality.[5] Reorientation of the onion magnetization state is accomplished by either applying a magnetic field[6-8] or injecting current.[9,10] Both of these reorientation mechanisms result in either an onion to vortex transition or a partial rotation of the onion's vortex-type domain wall. These methods are considered impractical due either to large energy requirements, in the case of applied field, or cumbersome wiring arrangements, in the case of current injection. Furthermore, neither of these two methods are capable of achieving coherent rotation of the onion state (onion to reverse onion transition), though this has been proposed.[11] Therefore, other ring switching approaches warrant study.

More recently, researchers[12-15] have suggested using mechanical and electric field induced strain as magnetic switching mechanism through the generation of magnetoelastic (ME) anisotropy in magnetoelectric heterostructures, although this has not been studied in the context of rings. ME anisotropy (e.g., $K_{ME}=(3/2)\lambda_s E|(\epsilon_y-\epsilon_x)|[J/m^3]$) is a function of the material's magnetostriction constant $\lambda_s$, Young's modulus Y, and induced strain anisotropy $\epsilon_y-\epsilon_x$. The $K_{ME}$ is used to overcome other energies, such as shape anisotropy and defect pinning, to reorient the magnetization direction (i.e., an easy axis). The induced anisotropic strain is generated electrically by combining a piezoelectric with a magnetostrictive material to form a magnetoelectric heterostructure or laminate.[16] One piezoelectric material that has been studied to produce anisotropic strains is a single crystal (011) $Pb(Mg_{1/3}Nb_{2/3})O_3]_{(1-x)}$-$[PbTiO_3]_x$ (PMN-PT). This particular cut produces tensile and compressive strains in two orthogonal in-plane axes (001 and 100) as well as providing a memory effect from the remnant strain states.[17]

Magnetoelectric heterostructures of this type are simple in design, requiring only electrodes on the piezoelectric member to achieve magnetic reorientation. While a few papers exist in the literature investigating magnetoelectric nanobar structures,[12] their application to ring geometries is absent.

One advantage associated with ring structures is the lower contribution of shape anisotropy to the Gibbs free energy as compared to nanobars or ellipses with aspect ratios larger than one. In this paper, we experimentally investigate the reorientation of the onion state in a nickel ring structure fabricated on a piezoelectric substrate. An un-poled 10×10× 0.5 mm³ single crystal (011) $Pb(Mg_{1/3}Nb_{2/3})O_3]_{(1-x)}$-[Pb-TiO$_3$]$_x$ (x≈0.32, Atom Optics Co., Ltd., Shanghai, China) with 5 nm Ti/50 nm Pt deposited as an adhesion layer/electrode is used as the substrate. On the top (011) PMN-PT surface, ring geometries were patterned using a dual-layer methyl methacrylate (MMA) liftoff resist and electron beam writing with a current of 1000 µC/cm². Three ring geometries with inner/outer diameters were studied: 350/500 nm, 700/1000 nm, and 1400/2000 nm. After ring pattern development, 5 nm Ti/35 nm Ni/2 nm Pt (adhesion, ferromagnetic, capping layer) was deposited by e-beam evaporation.

This was followed by lift off, resulting in nickel ring structures strain-coupled with the substrate. A schematic of the experimental setup and crystallographic orientation along with an SEM image of the ring structures are shown in FIG. 26. Magnetic force microscopy (MFM) images were collected by a Bruker Dimension 5000 scanning probe microscope using low-moment tips to eliminate tip-induced perturbations of the ring magnetization. Voltages are applied to the bottom electrode in situ while the top electrode and MFM tip are connected to a common ground to eliminate electrostatic interactions.

Figure 27A:
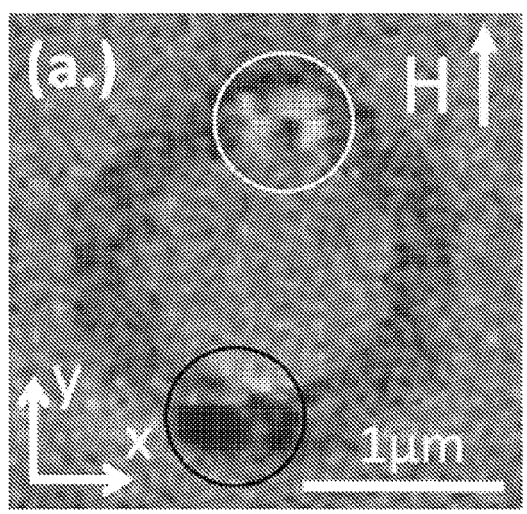
FIGS. 27A-27B shows magnetic force microscopy images of ring structures according to an embodiment of the current invention. (a) 2 μm ring structure in onion magnetization state along +y direction. (b) Ring after application of 0.8 MV/m to the PMN-PT substrate demonstrating near −90° rotation of magnetic dipoles.

Following fabrication and prior to poling (i.e., residual strain ~0) the rings are magnetically annealed in an externally applied field of 5 kOe along the y axis (see FIG. 26) to form the characteristic onion state after removing the field.11 As shown in FIG. 27A in the 2000 nm ring MFM image, the onion state can be identified by light and dark spots (i.e., circled regions) which are aligned with the direction of the applied magnetic field along the y-axis. These spots correspond to the location of highest magnetization divergence (i.e., tip-sample interaction) and mark the location of vortex-type domain walls.18 We note that the domain walls presented in FIG. 27A are not perfectly aligned with the applied magnetic field due to the existence of local energy wells which cause them to "relax" to a local energy minimum. These local energy minimums may be attributed to imperfections in the ring geometry and/or defects, grain boundaries in the material,18 or pre-stress due to the fabrication.

Figure 27B:
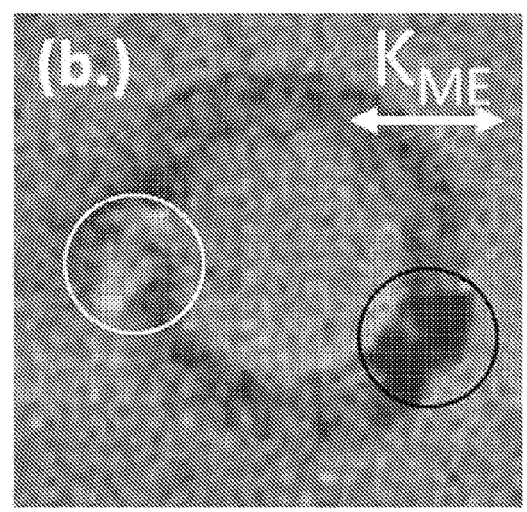
Figure 28:
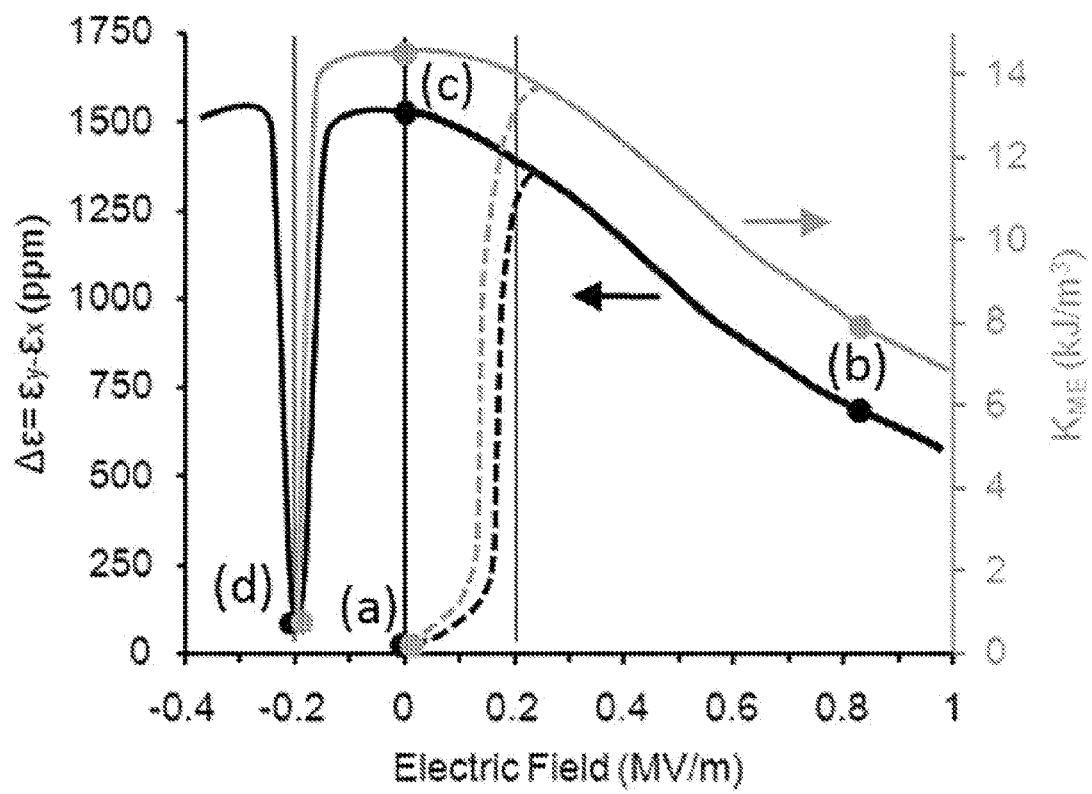
FIG. 28 shows in plane anisotropic strain (left) and magnetoelastic anisotropy (right) as a function of applied electric field. (a) Unpoled, zero strain state. (b) Poled substrate with constant applied field. (c) Poled substrate at remnant polarization state. (d) De-poled substrate after reversing electric field. Initial poling process is shown with dashed line.

After the magnetic field is removed, a ramped electric field up to 0.8 MV/m is applied to the ferroelectric substrate to pole the PMN-PT and is held constant. FIG. 28 plots the strain anisotropy (right ordinate axis) and magnetoelastic anisotropy (left ordinate axis) produced by the PMN-PT as a function of applied electric field (adapted from Wu et al.19). The anisotropic piezostrain at 0.8 MV/m (point b) is 700 µε consisting of −1200 µε along the x axis and __500 le along the y axis.16 The magnetoelastic anisotropy at 0.8 MV/m is ~7.4 kJ/m³ (i.e., Y=220 GPa and $\lambda_s$=−32 ppm for nickel). The combination of anisotropic strain and magnetoelastic anisotropy theoretically creates an easy axis along the x-axis. FIG. 27B shows an MFM image of the Ni ring structure as the electric field is held constant at 0.8 MV/m. Comparison of the MFM images in FIGS. 27A (field annealed) and 27B (0.8 MV/m) reveals that the location of the light and dark spots (i.e., vortex domain walls) has rotated 90° counter clockwise (CCW) and is now parallel with the x axis. More specifically, the vortex domain walls rotated to align with the magnetoelastic easy axis through the application of an electric field. Theoretically, the magnetoelastic anisotropy and induced strain should achieve a maximum rotation of 90° and these results approach this limit. In this example, a large number of these rings were investigated and in a variety of dimensions.

It should be noted that magnetization rotations were also observed in the 1000 and 500 nm diameter ring geometries. However, for the 1000 and 500 nm ring structure these rotations were not reproducible and the results were excluded from this example. Rotation events were only observed in a small fraction of these ring structures. We attribute the reproducibility (i.e., variability from ring to ring) issue to the higher incidence of pinning defects (e.g., most probably geometric defects due to processing issues) in 1000 and 500 nm rings (i.e., fabrication defects more prominent in smaller size) and/or the lack of a vortex type domain wall. With regard to the later point, the high mobility of the vortex domain walls in 2000 nm rings as compared to the transverse domain walls of 1000 nm and 500 nm rings is a topic which warrants further study. FIGS. 29A-29D show the behavior of the 2000 nm ring's magnetization under different electric field/strain conditions.

Figures 29A, 29B, 29C, 29D:
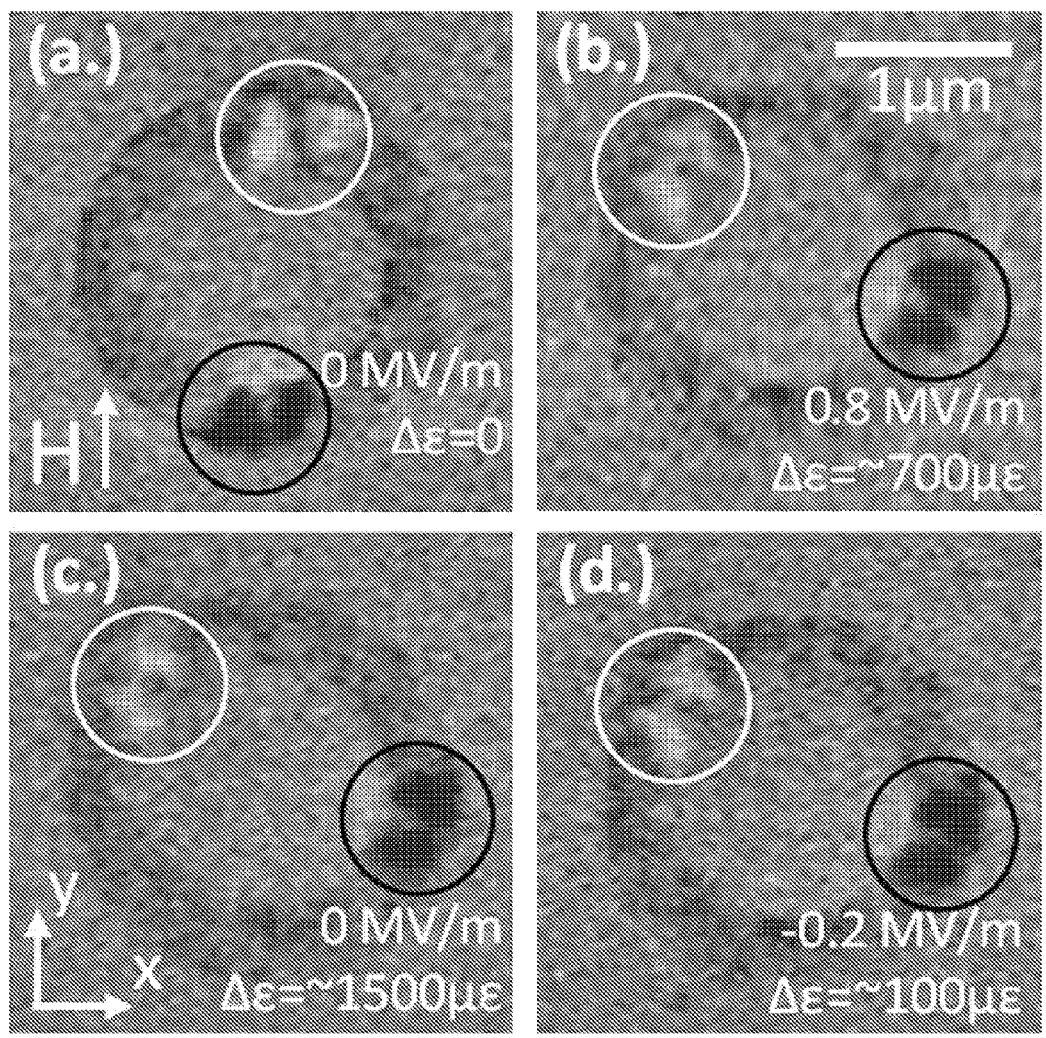
FIGS. 29A-29D shows magnetic force microscopy images of a 2000 nm ring structure under different strain states. (a) Onion initialized in the +y direction. (b) 0.8 MV/m applied to the PMN-PT substrate, note CCW rotation of magnetic poles. (c) 0.0 MV/m, note stability of magnetic rotation. (d) −0.2 MV/m to de-pole substrate.

For this example, a different 2000 nm ring is imaged with MFM. FIG. 29A is an MFM image after applying and releasing a saturating magnetic field (5 kOe) along the y axis. The PMN-PT induced strain state for this ring is found in FIG. 28 at point a (i.e., Δε=0). FIG. 29B shows an MFM image with 0.8 MV/m applied to the substrate (strain referenced to point b in FIG. 28) in which the onion state rotates ~45° CCW toward the easy axis. FIG. 29C shows that the magnetization remains in the same direction as for the 0.8 MV/m case shown in FIG. 29B after the electric field is removed (E=0.0 MV/m). This shows that for this electric field (see point c in FIG. 28) a remnant anisotropic strain of ~1500 µε is still present in the sample. The magnetization did not rotate upon removal of the electric field because the easy axis has not changed. In fact the magnitude of the anisotropy increased from ~7.4 kJ/m to ~16 kJ/m. Therefore, removal of the field made this a more favorable easy axis. Thus, a voltage is not required to maintain the magnetization direction due to the lack of a driving energy to reorient the vortex domain walls. To further illustrate the magnetoelastic origin of the rotation, an electric field of –0.2 MV/m (note change in polarity) is applied to de-pole the substrate and return it to a near-zero strain state20 (i.e., point d in FIG. 28). As shown in FIG. 29D the magnetization remains in the 45° CCW position, identical to FIGS. 29B and 29C, because once again an easy axis has not been created by the change in electric field. This can be seen by looking at the strain field and the magnetoelastic anisotropy shown in FIG. 28 point d. Therefore, further application of an electric field does not reorient the onion state. If reorientation with an electric field is desirable it can be achieved as Wu et al.20 demonstrated by depositing the structures on a partially poled substrate. A partially poled substrate biases the remnant strain and thus an easy axis can be created with the application of a pulsed electric field.

The ease of magnetic rotation in this system is due to a number of factors which combine to reduce the competing magnetic anisotropies. First, the radial symmetry of the ring structure reduces shape anisotropy such that any magnetization direction is energetically equivalent. Second, the electric field induced anisotropic strain from the piezoelectric substrate generates sufficient magnetoelastic anisotropy in the ring structure to rotate it to directions, though pinning defects remain an issue. Lastly, the vortex-type domain walls present in the thicker 2000 nm ring structures exhibit high exchange and low demagnetization energy,18 which may reduce the effect of magnetization pinning along the ring's normal surfaces. The relative lack of magnetic anisotropies in the ring system may enable interesting applications in which other anisotropies are introduced advantageously. For example, uniaxial anisotropy may be introduced through the addition of an exchange bias underlayer or with a magnetic field annealing process during the metal deposition, thereby creating a defined easy axis in the ring. Other easy axes could then be created magnetoeleastically using the coupled piezoelectric substrate, thus resulting in numerous stable magnetization configurations. Switching between two stable magnetization states could be accomplished with short electric field pulses to the substrate. This is one example of a bistable magnetic switching scheme for magnetic memory applications made possible by the ring geometry.

In summary, we achieved a permanent 90° rotation in the magnetization direction of patterned rings using only electric field-induced magnetoelastic anisotropy. This experiment serves to underscore the relevance of the strainmediated magnetoelectric effect in emergent technologies.

References For Example 4

1 E. C. Stoner and E. P. Wohlfarth, Philos. Trans. R. Soc. London, Ser. A 240, 599 (1948).
2 M. Klaui, C. A. F. Vaz, J. A. C. Bland, W. Wernsdorfer, G. Faini, E. Cambril, L. J. Heyderman, F. Nolting, and U. Rudiger, Phys. Rev. Lett. 94, 106601 (2005).
3 M. Weisheit, S. Fahler, A. Marty, Y. Souche, C. Poinsignon, and D. Givord, Science 315, 349 (2007).
4 R. C. O'Handley, Modern Magnetic Materials: Principles and Applications (John Wiley & Sons, New York, 2000).
5 M. Klaui, J. Rothman, L. Lopez-Diaz, C. A. F. Vaz, J. A. C. Bland, and Z. Cui, Appl. Phys, Lett. 78, 3268 (2001).
6 L. K. Lin, C. Y. Kuo, J. Y. Ou, C. C. Chang, C. R. Chang, L. Horng, and J. C. Wu, Phys. Status Solidi 4, 4360 (2007).
7 M.-F. Lai, C.-R. Chang, J. C. Wu, Z.-H. Wei, J. H. Kuo, and J.-Y. Lai, IEEE Trans. Mag. 38, 2550 (2002).
8 Y. G. Yoo, M. Klaui, and C. A. F. Vaz, L. J. Heyderman, and J. A. C. Bland, Appl. Phys. Lett. 82, 2470 (2003).
9 C. Nam, B. G. Ng, F. J. Castano, M. D. Mascaro, and C. A. Ross, Appl. Phys. Lett. 94, 082501 (2009).
10 G. Meier, M. Bolte, R. Eiselt, B. Kruger, D. H. Kim, and P. Fischer, Phys. Rev. Lett. 98, 187202 (2007).
11 J. Rothman, M. Klaui, L. Lopez-Diaz, C. A. F. Vaz, A. Bleloch, J. A. C. Bland, Z. Cui, and R. Speaks, Phys. Rev. Lett. 86, 1098 (2001).
12 T.-K. Chung, S. Keller, and G. P. Carman, Appl. Phys. Lett. 94, 132501 (2009).
13 A. Bur, T. Wu, J. Hockel, C.-J. Hsu, H. K. D. Kim, T.-K. Chung, K. Wong, K. L. Wang, and G. P. Carman, J. Appl. Phys. 109, 123903 (2011).
14 F. Zavaliche, T. Zhao, H. Zheng, F. Straub, M. P. Cruz, P. L. Yang, D. Hao, and R. Ramesh, Nano. Lett. 7(6), 1586 (2007).
15 T. Wu, A. Bur, J. L. Hockel, K. Wong, T.-K. Chung, and G. P. Carman, IEEE Magn. Lett. 2, 6000104 (2011).
16 J. Ryu, A. V. Carazo, K. Uchino, and H. Kim, J. Electroceram. 7, 24 (2001).
17 T. Wu, A. Bur, P. Zhao, K. P. Mohanchandra, K. Wong, K. L. Wang, C. S. Lynch, and G. P. Carman, Appl. Phys. Lett. 98, 012504 (2011).
18 M. H. Park, Y. K. Hong, B. C. Choi, M. J. Donahue, H. Han, and S. H. Gee, Phys. Rev. B 73, 094424 (2006).
19 T. Wu, P. Zhao, M. Bao, A. Bur, J. L. Hockel, K. Wong, K. P. Mohanchandra, C. S. Lynch, and G. P. Carman, J. Appl. Phys. 109, 124101 (2011).
20 T. Wu, A. Bur, K. Wong, P. Zhao, C. S. Lynch, P. K. Amiri, K. L. Wang, and G. P. Carman, Appl. Phys. Lett. 98, 262504 (2011).

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. An electronic device, comprising:
a first circuit;
a quasistatic variable capacitor selectively connectable to said first circuit to form a combined circuit; and
a second circuit selectively connectable to said quasistatic variable capacitor,
wherein said quasistatic variable capacitor comprises:
a first electrode,
a second electrode spaced apart from said first electrode, and
a ferroelectric element arranged between said first and second electrodes,
wherein said ferroelectric element has a plurality of quasistatic strain configurations and a corresponding plurality of quasistatic dielectric values that are selectable by the application of an electric field by said second circuit.

2. An electronic device according to claim 1, wherein said first circuit is a read circuit, said second circuit is a write circuit, and said quasistatic variable capacitor is a data storage element such that said electronic device is a nonvolatile data storage device.

3. An electronic device according to claim 1, wherein said combined circuit is at least one of a reconfigurable RC, LC or LRC oscillator circuit and said second circuit is a tuning circuit.

4. An electronic device according to claim 1, wherein said ferroelectric element is a crystalline relaxor ferroelectric satisfying the following

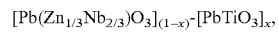

wherein x is greater than 0.0 and less than about 0.1.

5. An electronic device according to claim 1, wherein said ferroelectric element is a crystalline relaxor ferroelectric satisfying the following

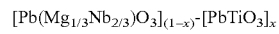

wherein x is greater than 0.30 and less than about 0.35.

6. An electronic device according to claim 5, wherein x is about 0.32.

* * * * *